US007088621B2

(12) United States Patent
Guterman et al.

(10) Patent No.: US 7,088,621 B2
(45) Date of Patent: Aug. 8, 2006

(54) BITLINE GOVERNED APPROACH FOR COARSE/FINE PROGRAMMING

(75) Inventors: Daniel C. Guterman, Fremont, CA (US); Nima Mokhlesi, Los Gatos, CA (US); Yupin Fong, Fremont, CA (US)

(73) Assignee: SanDisk Corporation, Milpitas, CA (US)

(*) Notice: Subject to any disclaimer, the term of this patent is extended or adjusted under 35 U.S.C. 154(b) by 0 days.

(21) Appl. No.: 11/207,427

(22) Filed: Aug. 18, 2005

(65) Prior Publication Data

US 2006/0039198 A1 Feb. 23, 2006

Related U.S. Application Data

(62) Division of application No. 10/839,806, filed on May 5, 2004, now Pat. No. 7,020,026.

(51) Int. Cl.
G11C 16/04 (2006.01)

(52) U.S. Cl. ............... 365/185.18; 365/185.28; 365/185.23

(58) Field of Classification Search ........... 365/185.03, 365/185.17, 185.18, 185.23, 185.24, 185.28
See application file for complete search history.

(56) References Cited

U.S. PATENT DOCUMENTS

| 4,357,685 | A | 11/1982 | Daniele et al. |
|---|---|---|---|
| 5,053,990 | A | 10/1991 | Kreifels et al. |
| 5,220,531 | A | 6/1993 | Blyth et al. |
| 5,313,421 | A | 5/1994 | Guterman et al. |
| 5,412,601 | A | 5/1995 | Sawada et al. |
| 5,521,865 | A | 5/1996 | Ohuchi et al. |
| 5,570,315 | A | 10/1996 | Tanaka et al. |
| 5,652,719 | A | 7/1997 | Tanaka et al. |
| 5,712,180 | A | 1/1998 | Guterman et al. |
| 5,712,815 | A | 1/1998 | Bill et al. |
| 5,761,222 | A | 6/1998 | Baldi |
| 5,870,344 | A | 2/1999 | Ozawa |
| 5,909,393 | A | 6/1999 | Tran et al. |
| 5,949,714 | A | 9/1999 | Hemink et al. |
| 5,991,202 | A | 11/1999 | Derhacobian et al. |
| 6,151,248 | A | 11/2000 | Harari et al. |
| 6,222,762 | B1 | 4/2001 | Guterman et al. |

(Continued)

FOREIGN PATENT DOCUMENTS

EP          1 154 439 A1    11/2001

OTHER PUBLICATIONS

Kurata, Hideaki, et al., Constant-Charge-Injection Programming for 10-MB/s Multilevel AG-AND Flash Memories, 2002 Symposium On VLSI Circuits Digest of Technical Papers, pp. 302-303.

(Continued)

Primary Examiner—Gene N. Auduong
(74) Attorney, Agent, or Firm—Vierra Magen Marcus & DeNiro LLP

(57) ABSTRACT

In a system for programming non-volatile storage, technology is disclosed for programming with greater precision and reasonable program times. In one embodiment, a first voltage is applied to a bit line for a first non-volatile storage element in order to inhibit that first non-volatile storage element. A first program voltage is applied to the first non-volatile storage element. For example, a program pulse is applied to a control gate for the first non-volatile storage element. During the program pulse, the bit line is changed from said first voltage to a second voltage, where the second voltage allows the first non-volatile storage element to be programmed.

37 Claims, 23 Drawing Sheets

U.S. PATENT DOCUMENTS

| | | |
|---|---|---|
| 6,243,290 B1 | 6/2001 | Kurata et al. |
| 6,259,624 B1 | 7/2001 | Nobukata |
| 6,266,270 B1 | 7/2001 | Nobukata |
| 6,282,117 B1 | 8/2001 | Tanaka et al. |
| 6,301,161 B1 | 10/2001 | Holzmann et al. |
| 6,307,785 B1 | 10/2001 | Takeuchi et al. |
| 6,317,364 B1 | 11/2001 | Guterman et al. |
| 6,363,010 B1 | 3/2002 | Tanaka et al. |
| 6,424,566 B1 | 7/2002 | Parker |
| 6,522,580 B1 | 2/2003 | Chen et al. |
| 6,525,964 B1 | 2/2003 | Tanaka et al. |
| 6,529,412 B1 | 3/2003 | Chen et al. |
| 6,532,172 B1 | 3/2003 | Harari et al. |
| 6,859,397 B1 | 2/2005 | Lutze et al. |
| 7,002,843 B1 * | 2/2006 | Guterman et al. ..... 365/185.03 |
| 7,020,026 B1 * | 3/2006 | Guterman et al. ..... 365/185.28 |
| 7,023,733 B1 * | 4/2006 | Guterman et al. ..... 365/185.17 |
| 2002/0003722 A1 | 1/2002 | Kanda et al. |
| 2002/0071312 A1 | 6/2002 | Tanaka et al. |
| 2002/0118574 A1 | 8/2002 | Gongwer et al. |
| 2003/0048662 A1 | 3/2003 | Park et al. |
| 2003/0147278 A1 | 8/2003 | Tanaka et al. |
| 2004/0032788 A1 | 2/2004 | Sakui et al. |
| 2005/0057965 A1 | 3/2005 | Cernea et al. |
| 2005/0057967 A1 | 3/2005 | Khalid et al. |
| 2005/0083735 A1 | 4/2005 | Chen et al. |

OTHER PUBLICATIONS

Johnson, William S., et al., SESSION XII: ROMs, PROMs and EROMs, 1980 IEEE International Solid State Circuits Conference, pp. 152-153.

Nobukata, Hiromi, et al., A 144Mb 8-Level NAND Flash Memory with Optimized Pulse Width Programming, 1999 Symposium on VLSI Circuits Digest of Technical Papers, pp. 39-40.

Ohkawa, Masayoshi, et al., TP 2.3: A 98 mm2 3.3V 64Mb Flash Memory with FN-NOR Type 4-level Cell, 1996 IEEE International Solid-State Circuits Conference, pp. 36-37.

Takeuchi, et al., A Source-line Programming Scheme for Low Voltage Operation NAND Flash Memories, 1999 Symposium on VLSI Circuits Digest of Technical Papers, pp. 37-38.

* cited by examiner

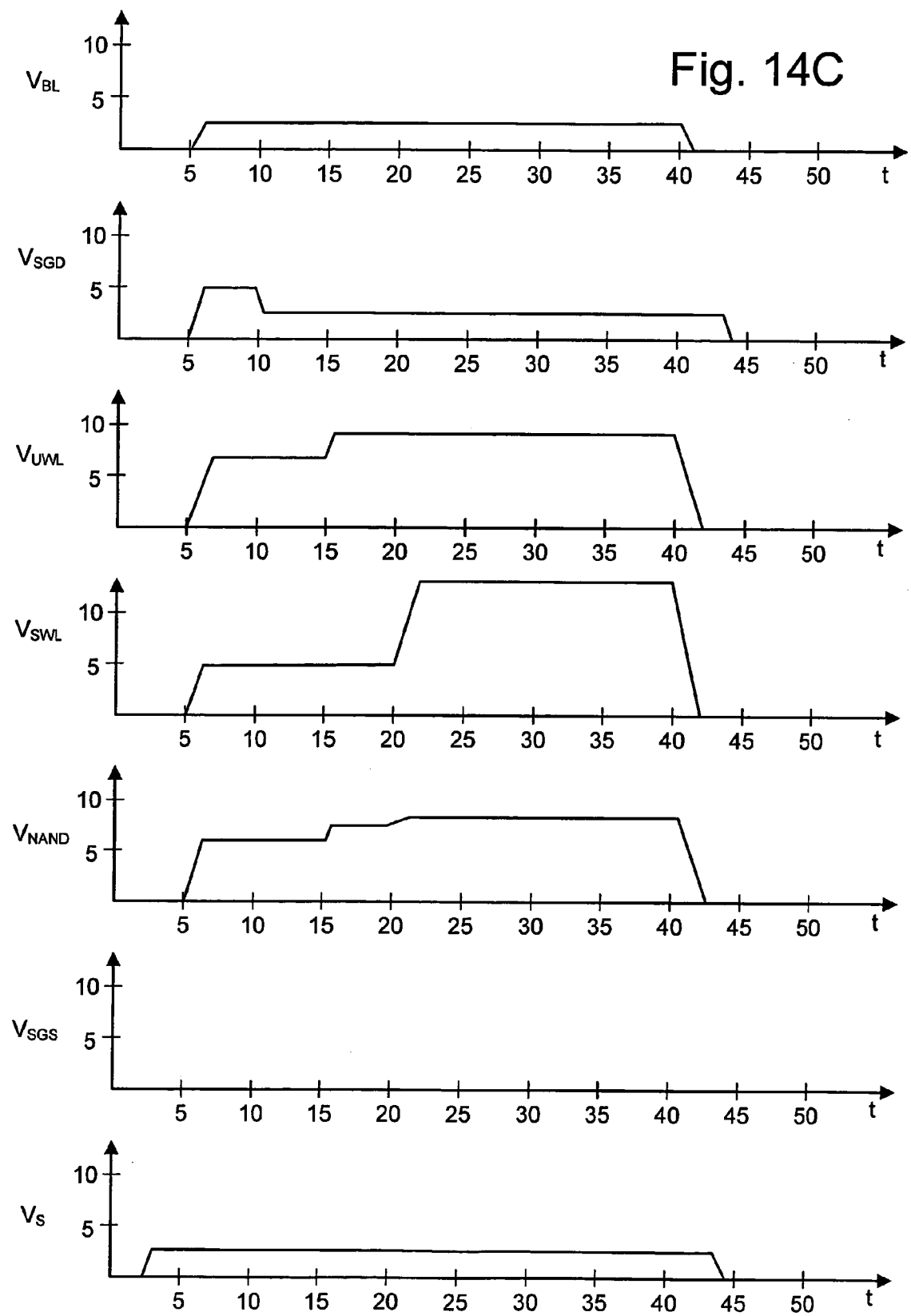

BITLINE GOVERNED APPROACH FOR COARSE/FINE PROGRAMMING

CROSS-REFERENCE TO RELATED APPLICATIONS

This application is a divisional application of U.S. patent application Ser. No. 10/839,806, entitled "BITLINE GOVERNED APPROACH FOR PROGRAM CONTROL OF NON-VOLATILE MEMORY," filed May 5, 2004 now U.S. Pat. No. 7,020,026; incorporated herein by reference in its entirety.

The following application is cross-referenced and incorporated by reference herein in its entirety:

U.S. patent application Ser. No. 10/839,764, entitled BOOSTING TO CONTROL PROGRAMMING OF NON-VOLATILE MEMORY, Daniel C. Guterman, Nima Mokhlesi, and Yupin Fong, filed May 5, 2004.

BACKGROUND OF THE INVENTION

1. Field of the Invention

The present invention relates to technology for programming non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory cell can be programmed/erased between two states (an erased state and a programmed state). When programming an all tunneling based EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

A multi-state flash memory cell is implemented by identifying multiple, distinct allowed threshold voltage ranges separated by forbidden voltage ranges. Each distinct threshold voltage range corresponds to a predetermined value for the set of data bits.

Typically, the program voltage applied to the control gate is applied as a series of pulses. The magnitude of the pulses is increased with each successive pulse by a predetermined step size (e.g. 0.2 v). In the periods between the pulses, verify operations are carried out. As the number of programmable states increase, the number of verify operations increases and more time is needed. One means for reducing the time burden of verifying is to use a more efficient verify process, such as the process that is disclosed in U.S. patent application Ser. No. 10/314,055, "Smart Verify for Multi-State Memories," filed Dec. 5, 2002, incorporated herein by reference in its entirety. However, there is a consumer demand for memory devices that program as fast as possible. For example, a user of a digital camera that stores images on a flash memory card does not want to wait between pictures.

In addition to programming with reasonable speed, to achieve proper data storage for a multi-state memory cell, the multiple ranges of threshold voltage levels of the multi-state memory cell should be separated from each other by sufficient margin so that the level of the memory cell can be programmed and read in an unambiguous manner. Additionally, a tight threshold voltage distribution is recommended. To achieve a tight threshold voltage distribution, small program steps typically have been used, thereby programming the threshold voltage of the cells more slowly. The tighter the desired threshold distribution, the smaller the steps and the slower the programming process.

One solution for achieving tight threshold distributions without unreasonably slowing down the programming process is to use a two phase programming process. The first phase, a coarse programming phase, includes attempts to raise the threshold voltage in a faster manner and paying relatively less attention to achieving a tight threshold distribution. The second phase, a fine programming phase, attempts to raise the threshold voltage in a slower manner in order to reach the target threshold voltage while also achieving a tighter threshold distribution. Example of coarse/fine programming methodologies can be found in the following patent documents that are incorporated herein by reference in their entirety: U.S. patent application Ser. No. 10/766,217, "Efficient Verification for Coarse/Fine Programming of Non-Volatile Memory" filed Jan. 27, 2004; U.S. patent application Ser. No. 10/051,372, "Non-Volatile Semiconductor Memory Device Adapted to Store A Multi-Valued Data in a Single Memory Cell," filed Jan. 22, 2002; U.S. Pat. Nos. 6,301,161; 5,712,815; 5,220,531; and 5,761,222.

As memory devices become smaller and more dense, the need for tighter threshold distributions and reasonable program times has increased. Although the coarse/fine programming methodology provides a solution to some existing issues, there is further need to improve the coarse/fine programming methodology to provide the desired tighter threshold distributions and reasonable program times.

SUMMARY OF THE INVENTION

The present invention, roughly described, pertains to technology for programming non-volatile memory with greater precision and reasonable program times. The present invention can be used to improve the coarse/fine programming methodology and/or can be used on its own without implementing coarse/fine programming.

One embodiment of the present invention includes applying a first voltage to a bit line for a first non-volatile storage element, applying a first program voltage to a control gate of the first non-volatile storage element while applying the first voltage to the bit line for the first non-volatile storage element, lowering the first program voltage applied to the control gate of the first non-volatile storage element while applying the first voltage to the bit line for said first non-volatile storage element, applying a second voltage to the bit line while the first program voltage is lowered, and raising the first program voltage applied to the control gate of the first non-volatile storage element while applying the second voltage to the bit line for the first non-volatile storage element.

For example, in one implementation, the first non-volatile storage element is a NAND type flash memory device that is part of a NAND string. The application of the first program voltage includes applying a program pulse to the control gate of the NAND type flash memory device. The first voltage applied to the bit line is at a voltage level that inhibits programming and the second voltage applied to the bit line is at a voltage level that allows programming. The bit line is changed from the first voltage to the second voltage during the time for applying a program pulse. This process can be repeated for additional program pulses.

Another embodiment of the present invention includes applying a first program voltage to a plurality of non-volatile storage elements, where a first set of the non-volatile storage elements are in a coarse programming mode and a second set of the non-volatile storage elements are in a fine programming mode. The process further includes providing a programming bit line voltage to bit lines for the first set of non-volatile storage elements during the first program voltage, providing an inhibit bit line voltage to bit lines for the second set of non-volatile storage elements during the first program voltage, and changing the bit lines for the second set of non-volatile storage elements during the first program voltage to allow programming of the second set of non-volatile storage elements.

One or more implementations of the present invention may include programming one or more non-volatile storage elements. For example, the present invention can be used to program an array of flash memory devices. In some example implementations, the programming of the one or more non-volatile storage elements is performed by or at the direction of a control circuit. The components of the control circuit may differ based on the particular application. For example, a control circuit may include any one of the following components or any combination of the following components: controller, command circuits, state machine, row control, column control, source control, p-well or n-well control, or other circuits that perform similar functionality.

These and other objects and advantages of the present invention will appear more clearly from the following description in which the preferred embodiment of the invention has been set forth in conjunction with the drawings.

BRIEF DESCRIPTION OF THE DRAWINGS

FIGS. 14A, 14B, 14C and 15 are timing diagram describing various embodiments of a process for programming.

DETAILED DESCRIPTION

The invention is illustrated by way of example, and not by way of limitation, in the figures of the accompanying drawings in which like references indicate similar elements. It should be noted that references to an or one embodiment in this disclosure are not necessarily the same embodiment, and such references mean at least one.

In the following description, various aspects of the present invention will be described. However, it will be apparent to those skilled in the art that the present invention may be practiced with only some or all of the aspects of the present disclosure. For purposes of explanation, specific numbers, materials and configurations are set forth in order to provide a thorough understanding of the invention. However, it will be apparent to one skilled in the art that the present invention may be practiced without all of the specific details. In other instances, well known features are omitted or simplified in order not to obscure the present invention.

Various embodiments will be described as multiple discrete steps in turn, in a manner that is most helpful in understanding the present invention. However, the order of this description should not be construed as to imply that these operations are necessarily order dependent.

Figure 1:
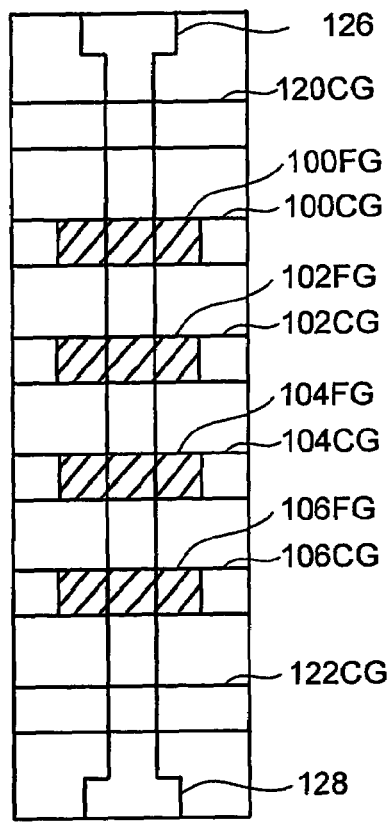
FIG. 1 is a top view of a NAND string.
Figure 2:
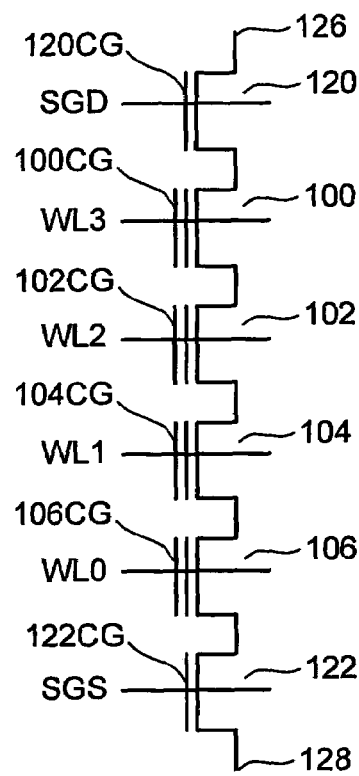
FIG. 2 is an equivalent circuit diagram of the NAND string.

One example of a flash memory system suitable for implementing the present invention uses the NAND structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD, and select gate 122 is connected to select line SGS.

Figure 3:
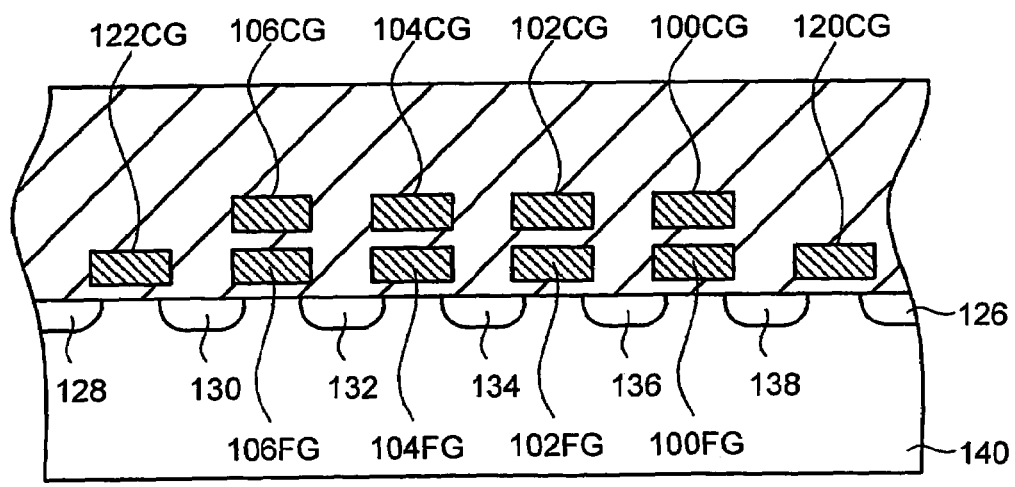
FIG. 3 is a cross sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an inter-polysilicon dielectric layer separating the control gate and floating gate. The control gates of the memory cells (100, 102, 104, 106) form the word lines. N+ diffused layers 130, 132, 134, 136 and 138 are shared between neighboring cells, whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1–3 show four memory cells in the NAND string, the use of four transistors is only provided as an example. A NAND string can have less than four memory cells or more than four memory cells. For example, some NAND strings will include 8 memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, for example, thereby storing multiple bits of digital data. In the case of storing multiple levels of data, the range of possible threshold voltages is divided into the number of storage levels. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528 and U.S. patent application. Ser. No. 09/893,277 (Publication No. US2003/0002348). Information about programming NAND flash memory, including self boosting techniques, can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety. Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

Figure 4:
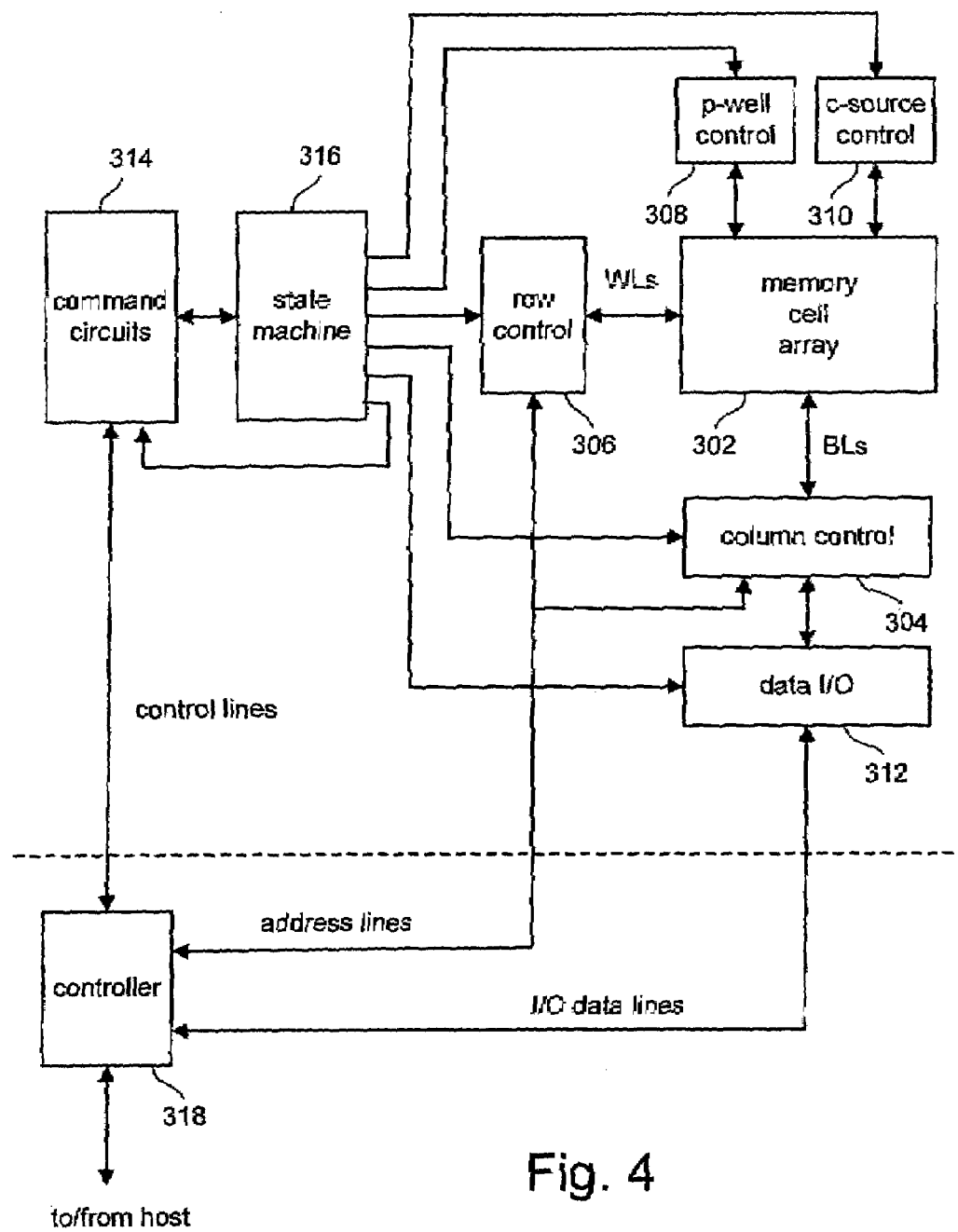
FIG. 4 is a block diagram of one embodiment of a non-volatile memory system in which the various aspects of the present invention are implemented.

FIG. 4 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 5) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller (or control capability) can be embedded in the host or included within a removable memory system.

In some implementations, some of the components of FIG. 4 can be combined. In various designs, one or more of the components of FIG. 4, other than memory cell array 302, can be thought of as a control circuit.

Figure 5:
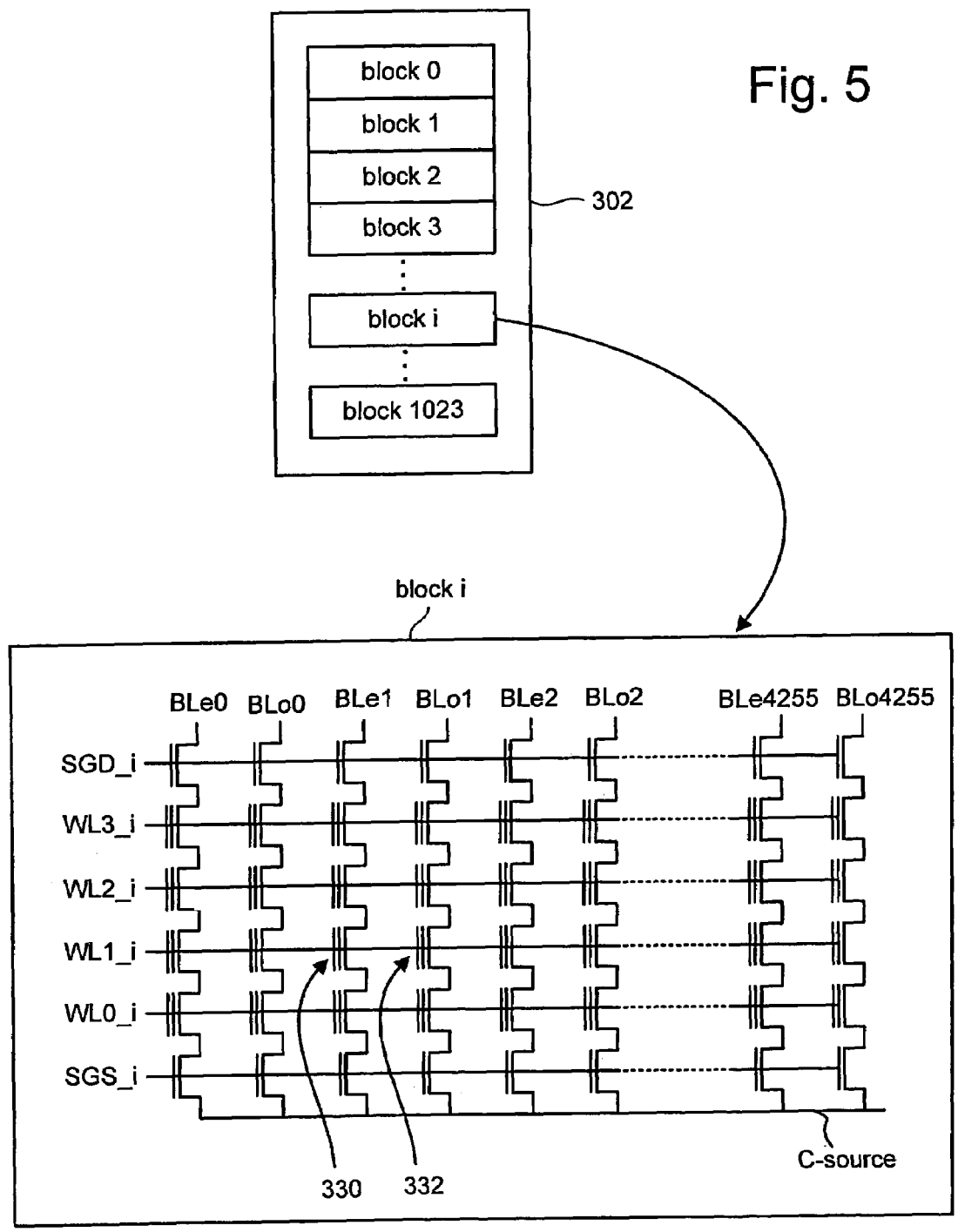
FIG. 5 illustrates an example of an organization of a memory array.

With reference to FIG. 5, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 5 shows four memory cells connected in series to form a NAND string. Although four cells are shown to be included in each NAND string, more or less than four memory cells can be used. One terminal of the NAND string is connected to corresponding bit line via a first select transistor SGD, and another terminal is connected to c-source via a second select transistor SGS.

During one embodiment of read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g. a multi-level cell), wherein each of these two bits are stored in a different page, one block stores 16 logical pages. Other sized blocks and pages can also be used with the present invention. Additionally, architectures other than that of FIGS. 4 and 5 can also be used to implement the present invention.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

In the read and verify operations, the select gates (SGD and SGS) and the unselected word lines (e.g., WL0, WL2 and WL3) are raised to a read pass voltage (e.g. 4.5 volts) to make the transistors operate as pass gates. The selected word line (e.g. WL1) is connected to a voltage, a level of which is specified for each read and verify operation in order to determine whether a threshold voltage of the concerned memory cell is above or below such level. For example, in a read operation for a two level memory cell, the selected word line WL1 may be grounded, so that it is detected whether the threshold voltage is higher than 0V. In a verify operation for a two level memory cell, the selected word line WL1 is connected to 0.8V, for example, so that it is verified whether or not the threshold voltage has reached at least 0.8V. The source and p-well are at zero volts. The selected bit lines (BLe) are pre-charged to a level of, for example, 0.7V. If the threshold voltage is higher than the read or verify level on the word line, the potential level of the bit line (BLe) associated with the cell of interest (e.g., BLe1 for cell 330) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is thereby detected by a voltage comparator sense amplifier that is connected to the bit line.

The erase, read and verify operations described above are performed according to techniques known in the art. Thus, many of the details explained can be varied by one skilled in the art. Other read and verify techniques known in the art can also be used.

Figure 6:
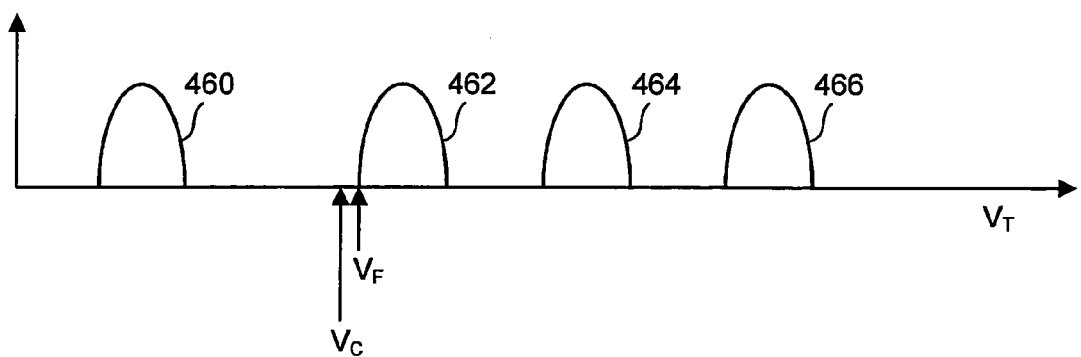
FIG. 6 shows threshold voltage distributions for a multi-state non-volatile memory device.

FIG. 6 illustrates threshold voltage distributions for memory cells storing two bits of data (e.g., four data states). In one embodiment, distribution 460 represents a distribution of threshold voltages of cells that are in the erased state (e.g., storing "11"), having negative threshold voltage levels. Distribution 462 represents a distribution of threshold voltages of cells that are storing "10," having positive threshold voltage levels. Distribution 464 represents a distribution of threshold voltages of memory cells storing "00." Distribution 466 represents a distribution of threshold voltages of cells that are storing "01." In other embodiments, each of the distributions can correspond to different data states than described above. In some implementations (as exemplified above), these data values (e.g. logical states) are assigned to the threshold ranges using a gray code assignment so that if the threshold voltage of a floating gate erroneously shifts to its neighboring physical state, only one logical bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Additionally, the present invention can work with memory cells that store more than two bits of data.

In one implementation, a memory cell in the erased state (e.g., distribution 460) can be programmed to any of the program states (distributions 462, 464 or 466). In another embodiment, memory cells in the erased state are programmed according to a two-step methodology. In this two-step methodology, each of the bits stored in a data state correspond to different logical pages. That is, each bit stored in a memory cell has a different logical page address, pertaining to a lower logical page and an upper logical page. For example, in state "10," the "0" is stored for the lower logical page and the "1" is stored for the upper logical page. In a first programming step, the cell's threshold voltage level is set according to the bit to be programmed into the lower logical page. If that bit is a logic "1," the threshold voltage is not changed since it is in the appropriate state as a result of having been earlier erased. However, if the bit is to be programmed to a logic "0," the threshold level of the cell is increased to be within the threshold voltage distribution 462.

In the second programming step, the memory cell's threshold voltage level is set according to the bit being programmed into the upper logical page. If the upper logical page bit is to be logic "1," then no further programming occurs since the cell is in one of the states corresponding to the threshold voltage distribution 460 or 462, both of which carry an upper page bit of "1." If the upper logical page bit is to be logic "0" and the first step resulted in the cell remaining in the erased state corresponding to threshold 460, then the second step of the programming process includes raising the threshold voltage to be within threshold distribution 466. If the upper logical page bit is to be logic "0" and the cell had been programmed into the state corresponding to threshold distribution 462 as a result of the first programming step, then the second step of the programming process includes raising the threshold voltage to be within threshold voltage distribution 464. The two step process is just one example of a methodology for programming multi-state memory. Many other methodologies, including a one step process or more than two steps can be used. Although FIG. 6 shows four states (two bits), the present invention can also be used with other multi-state structures including those that include eight states, sixteen states, thirty-two states, and others.

Figure 7:
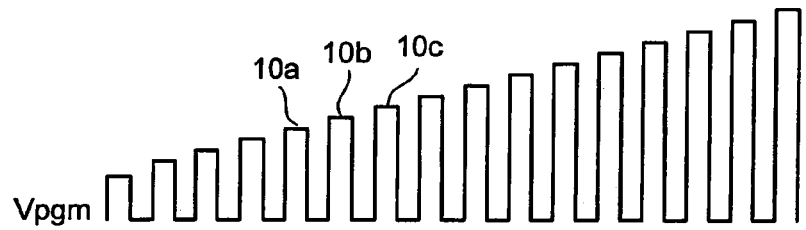
FIG. 7 depicts a programming voltage signal, which includes a set of programming pulses with magnitudes increasing over time.

When programming an all tunneling based EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised to one of the threshold voltage distributions described above. Typically, the program voltage applied to the control gate is applied as a series of pulses. In one embodiment, the magnitude of the pulses is increased with each successive pulse by a predetermined step size (e.g. 0.4 v, 0.2 v, or others). FIG. 7 shows a program voltage signal Vpgm applied to the control gates (or, in some cases, steering gates) of flash memory cells. The program voltage signal Vpgm includes a series of pulses that increase in magnitude over time.

Figure 8:
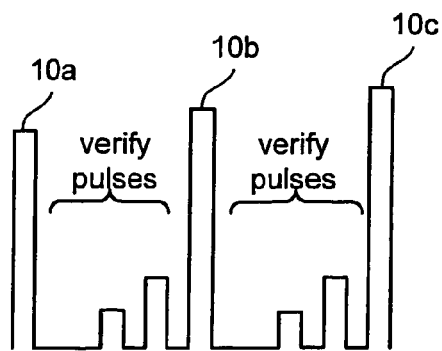
FIG. 8 depicts three of the programming pulses from the signal of FIG. 7, and the verification pulses between the programming pulses.

In the periods between the program pulses, verify operations are carried out. That is, the programming level of each cell of a group of cells being programmed in parallel is read between successive programming pulses to determine whether it is equal to or greater than a verify level to which it is being programmed. For arrays of multi-state flash memory cells, the memory cells will perform a verification step of each state to allow determination of whether the cell has reached its data associated verify level. For example, a multi-state memory cell capable of storing data in four states may need to perform verify operations for three compare points. FIG. 8 shows three programming pulses 10a, 10b and 10c (each of which are also depicted in FIG. 7). Between the programming pulses are three verify pulses in order to perform three verify operations. Based on the three verify operations, the system can determine whether or not the memory cells have reached their corresponding data state verify levels. Note that one of the verify levels is at 0 volts.

Figure 9:
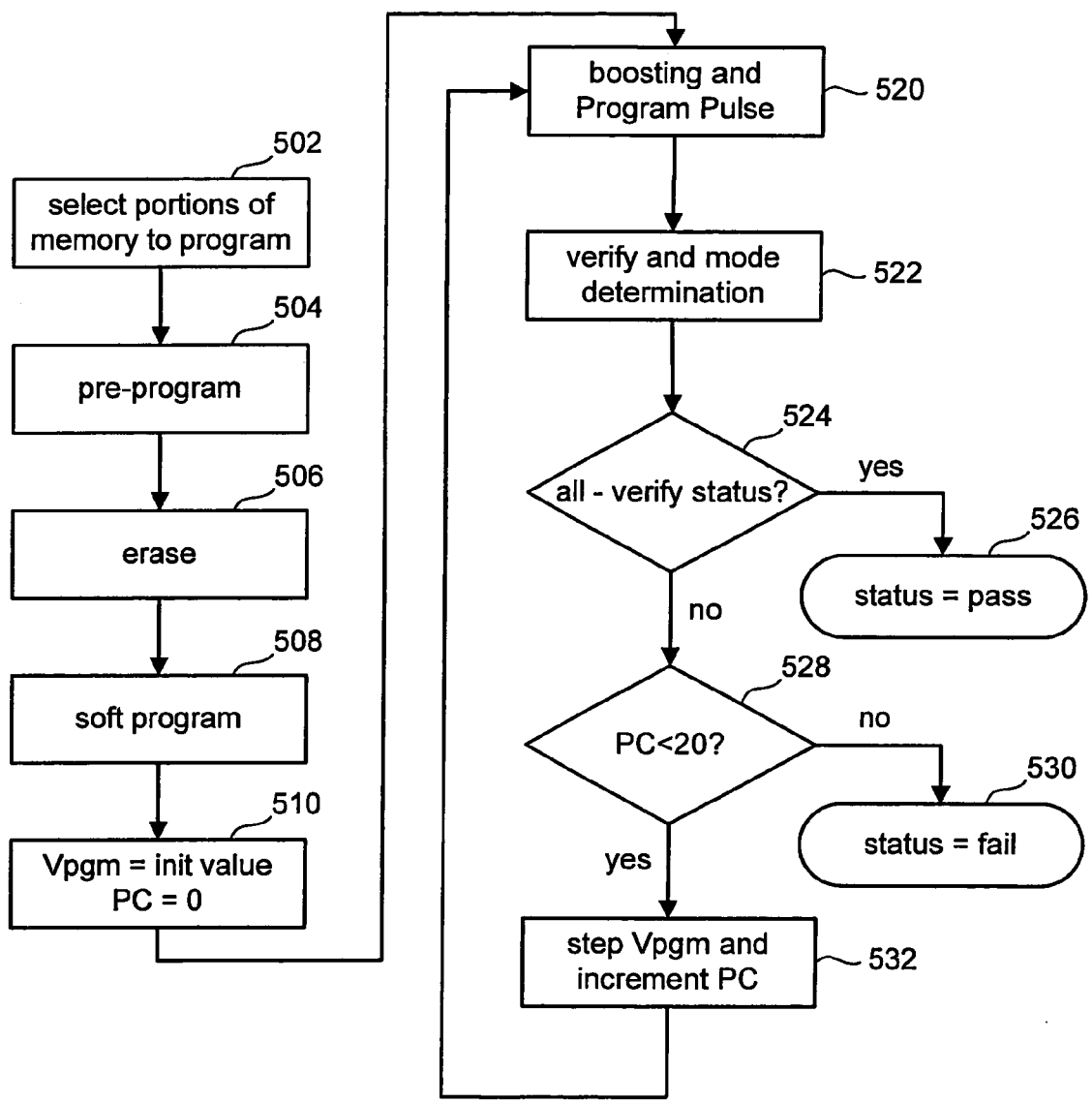
FIG. 9 is a flow chart describing one embodiment of a process for programming flash memory.

FIG. 9 is a flow chart describing one embodiment of a process for programming using the coarse/fine programming process. In step 502, the portion of the memory to be programmed is selected. In one implementation, this can be one or more write units appropriate to the memory structure. One example of a write unit is referred to as a page. In other embodiments, other units and/or structures can also be used. In step 504, a pre-programming (or pre-erase) process is sometimes used wherein the addressed memory cells are given non-data dependent programming to level out storage element wear and provide a more uniform starting point for the subsequent erase. In step 506, an erase process is performed, as appropriate for the type of storage element being used. One example of a suitable smart erase process is described in U.S. Pat. No. 5,095,344, incorporated herein by reference in its entirety. Step 508 includes a soft programming process designed to put the threshold voltages of erased memory cells into a more uniform starting range for the actual write phase. In one embodiment, if any of the memory cells fail to verify during erase (or during soft programming), they can be mapped out of the logical address space. At this point the memory is ready for the data conditional programming phase.

In step 510, the program voltage (Vpgm) is set to an initial value. For example, in some embodiments, the staircase wave form of FIG. 7 is used and step 510 includes setting the initial pulse. Also, in step 510, a program counter (PC) is initialized to zero, and (typically) the programming operation and associated register is set into the coarse mode. In step 520, boosting of the NAND strings is performed and a program pulse is applied. More information about step 520 is described below. In step 522, a verification process is performed. None, one or more memory cells are verified for coarse programming and none, one or more memory cells are verified for fine programming, as required. For example in regard to binary memory cells (e.g., two states), while some memory cells are being verified for coarse programming, other memory cells are being verified for fine programming. With regard to multi-state memory cells, while some memory cells are being verified for coarse programming for a particular state, other memory cells are being verified for fine programming for the same particular state. In other embodiments regarding multi-state memory cells, different memory cells can be concurrently programmed/ verified for different states where some memory cells are being verified for coarse programming while other memory cells are being verified for fine programming. Also in step 522, the system determines which memory cells need to switch from the coarse mode to the fine mode of programming. More details of step 522 are described below.

In step 524, it is determined whether all of the memory cells have verified that their threshold voltages have satisfied the respective final or target threshold voltages. If so, the programming process is completed successfully (status=pass) in step 526. If all of the memory cells are not verified, then it is determined whether the program counter (PC) is less than 20. If the program counter (PC) is not less than 20 (step 528), then the program process has failed (step 530). If the program counter (PC) is less than 20, then the program counter (PC) is incremented by 1 and the program voltage is stepped up to the next pulse in step 532. Subsequent to step 532, the process loops back to step 520 and the next program pulse is applied to the memory cells.

Figure 10:
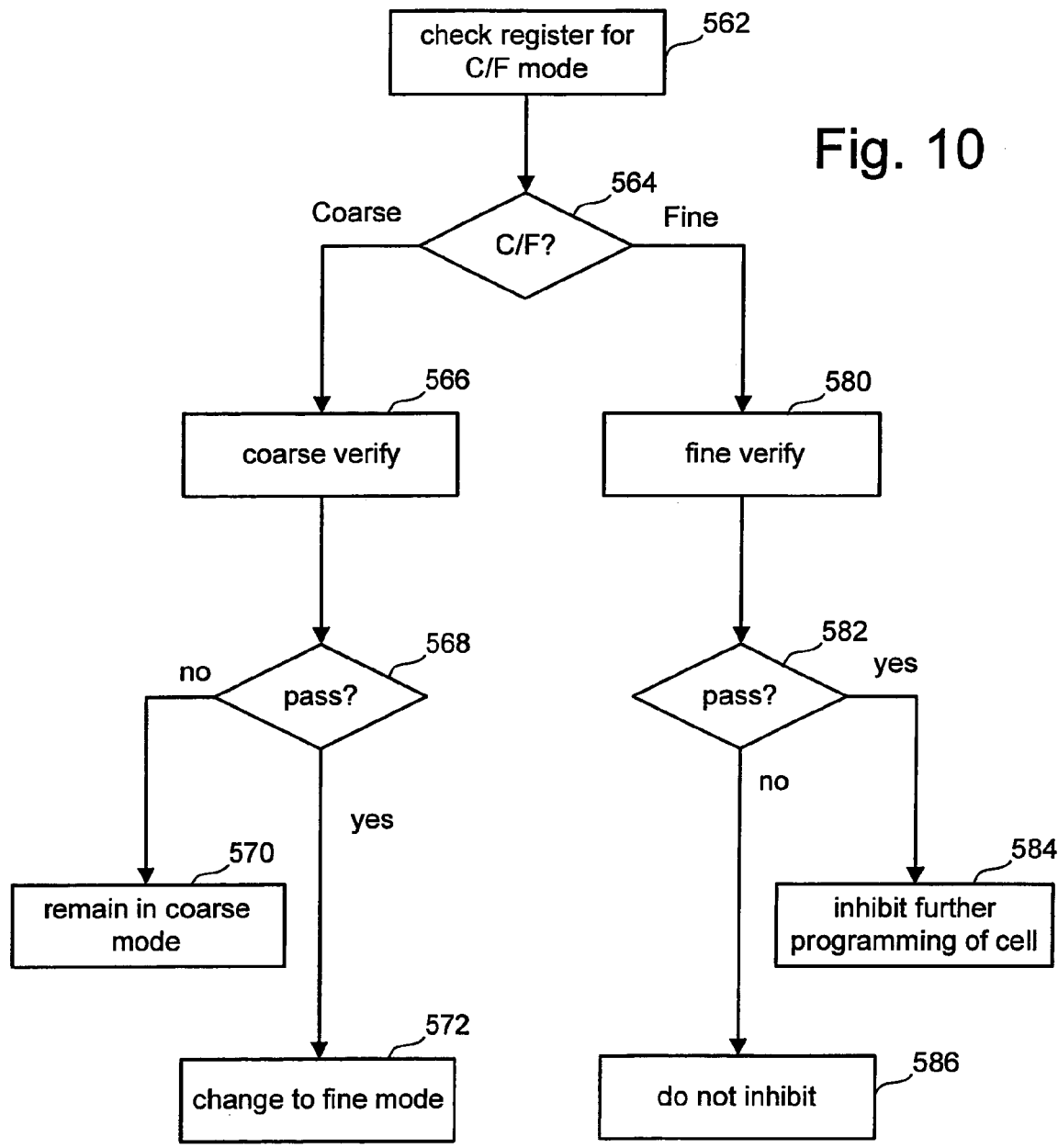
FIG. 10 is a flow chart describing one embodiment of a process for performing verification and coarse/fine mode determination.

FIG. 10 provides a flow chart describing more details of one embodiment of a process for verifying and determining programming mode (step 522 of FIG. 9). In step 562 of FIG. 10, the system will check a register (or other storage device) to determine whether the particular flash memory cell is in the coarse programming mode or the fine programming mode. If the memory cell is in the coarse phase (step 564), then a coarse verification is performed in step 566. For example, looking at FIG. 6, the memory cell could have its threshold voltage compared to threshold voltage level $V_C$ that is a little lower than the final or target threshold voltage level $V_F$ for the programming operation. Note that FIG. 6 shows $V_C$ and $V_F$ for threshold voltage distribution 462; however, in many embodiments there would be $V_C$ and $V_F$ for each threshold voltage distribution that a memory cell can be programmed to. If the threshold voltage of the memory cell is at or above $V_C$ for the target state, then the memory cell has passed the coarse verification test (step 568). If the threshold voltage of the memory cell is less $V_C$ for the target state, then the memory cell has not passed the verification test. If the memory cell has not passed the coarse verification test (see step 568), then the memory cell remains in the coarse programming mode (step 570). If the memory cell has passed the coarse verification test, the memory cell will change programming modes to the fine programming mode (step 572).

If, in step 564, it is determined that the memory cell was in the fine programming mode, then a fine verification process will be performed in step 580. For example, looking at FIG. 6, the threshold voltage of the memory cell can be compared to the final target threshold voltage $V_F$. If the memory cell's threshold voltage is at or greater than the target voltage $V_F$ (step 582), then the fine verification test has passed and the memory cell will be inhibited or terminated from further programming (step 584) during that programming session. One embodiment for inhibiting a memory cell from further programming is to raise the bit line to Vdd during the programming operation. Other means for inhibiting or locking out a memory cell can also be used. If, in step 582, it is determined that the verification test did not pass (e.g. because the threshold voltage of the memory cell is less than target voltage $V_F$), then the memory cell will not be inhibited from further programming (step 586).

The process in FIG. 10 is performed on an individual cell. In many embodiments, multiple memory cells will be programmed concurrently. Thus, the process of FIG. 10 will be performed on multiple memory cells concurrently. During such programming, some of the memory cells will be in the coarse programming process while other cells are in the fine programming process, while others still will be inhibited from programming.

As mentioned above, when programming in one embodiment, every other bit line is selected for programming. For example, all the even bit lines can be selected for programming while all the odd lines are not selected for programming. In other embodiments, different groups of bit lines can be selected for programming. Selecting a bit line is one means of selecting which NAND strings will be programmed in a particular programming operation. For any given programming operation, one of the memory cells on the NAND string will be selected. For example, looking back at FIG. 5, assume that memory cell 330 is selected for programming. Thus, even bit lines are selected for programming and word line WL1 is selected for programming. As can be seen from FIG. 5, WL1 is connected to both memory cell 330 and memory cell 332. Thus, a word line program pulse will be applied to both memory cell 330 and memory cell 332, even though memory cell 330 is selected for programming and memory cell 332 is not selected for programming. It is well known in the art that a problem arises when it is desired to program one cell on a word line without programming all other cells connected to the same word line. Because a program voltage is applied to all cells connected to a word line, an unselected cell (e.g. memory cell 332) may become inadvertently programmed (or partially programmed). The simultaneous programming of the unselected cell is referred to as "program disturb."

Several techniques can be employed to prevent program disturb. In one method known as "self-boosting," the unselected bit lines are raised to an inhibit voltage (e.g., Vdd) and a pass voltage (e.g., 9 volts) is applied to the unselected word lines during programming, thereby coupling the underlying channels and interconnecting diffusions (whose starting conditions can be optionally initialized to a pre-charged condition, e.g., 1.5 volts) to a potential of about 7.5 volts. This results in the channel of the memory cell associated with the programming control gate (whose potential can ultimately get stepped up to approximately 20 volts) getting raised to that 7.5 volt level, thereby, lowering the differential voltage across the tunneling oxide sufficiently to inhibit such programming disturb.

For more details, consider that a transistor in a NAND string will turn on if $V_G-V_S>V_{TH}$, where $V_G$ is the voltage applied to the gate, $V_S$ is the voltage at the source and $V_{TH}$ is threshold voltage of the transistor. The NAND transistor is symmetrical in that either side could be the source or the drain. The side with the lower voltage is typically referred to as the source. Thus, as voltages change, which side is the source and which side is the drain may also change. If $V_G-V_S$ is less than $V_{TH}$, then the device is cut off (no conduction between source and drain). At a given $V_G$, if both $V_S$ and $V_D$ are increased sufficiently so that $V_G-V_S<V_{TH}$ (remember that $V_D \geq V_S$), then the device is also cut-off.

To inhibit a NAND string from programming, the unselected bit lines are raised to Vdd. In one embodiment, the selected control gate of the drain side select gate (SGD in FIG. 2) is also set at Vdd, causing the select gate to conduct to the lower biased source connected to the NAND string. The unselected NAND strings, associated with the unselected bit lines, are then boosted by the pass voltages applied to the unselected word lines associated with those NAND strings, which capacitively raises the voltage within the NAND strings. When the voltage in the NAND string reaches $V_G-V_{TH}$, then the select gate will cut-off, thereby isolating the NAND string from the bit line so that the voltage coupled on the NAND string will not discharge into the bit line. The voltage on the NAND string will then continue to increase in concert with increasing pass voltage so that it is higher than $V_G$. However, because the bit line bias is not less than $V_G-V_{TH}$, the select gate will remain cut-off, allowing the voltage in the NAND string to continue increasing to about 7.5 volts. When the voltage in the channel is at 7.5 volts, the voltage differential across the tunnel dielectric of the selected word line is not great enough to allow for tunneling of electrons into the floating gate. There are other methods for reducing program disturb, including local self-boosting and erased area self-boosting. Many of these boosting approaches are discussed in U.S. patent application Ser. No. 10/379,608, "Self-Boosting Technique," filed on Mar. 5, 2003, incorporated herein by reference in its entirety.

Figure 11A:
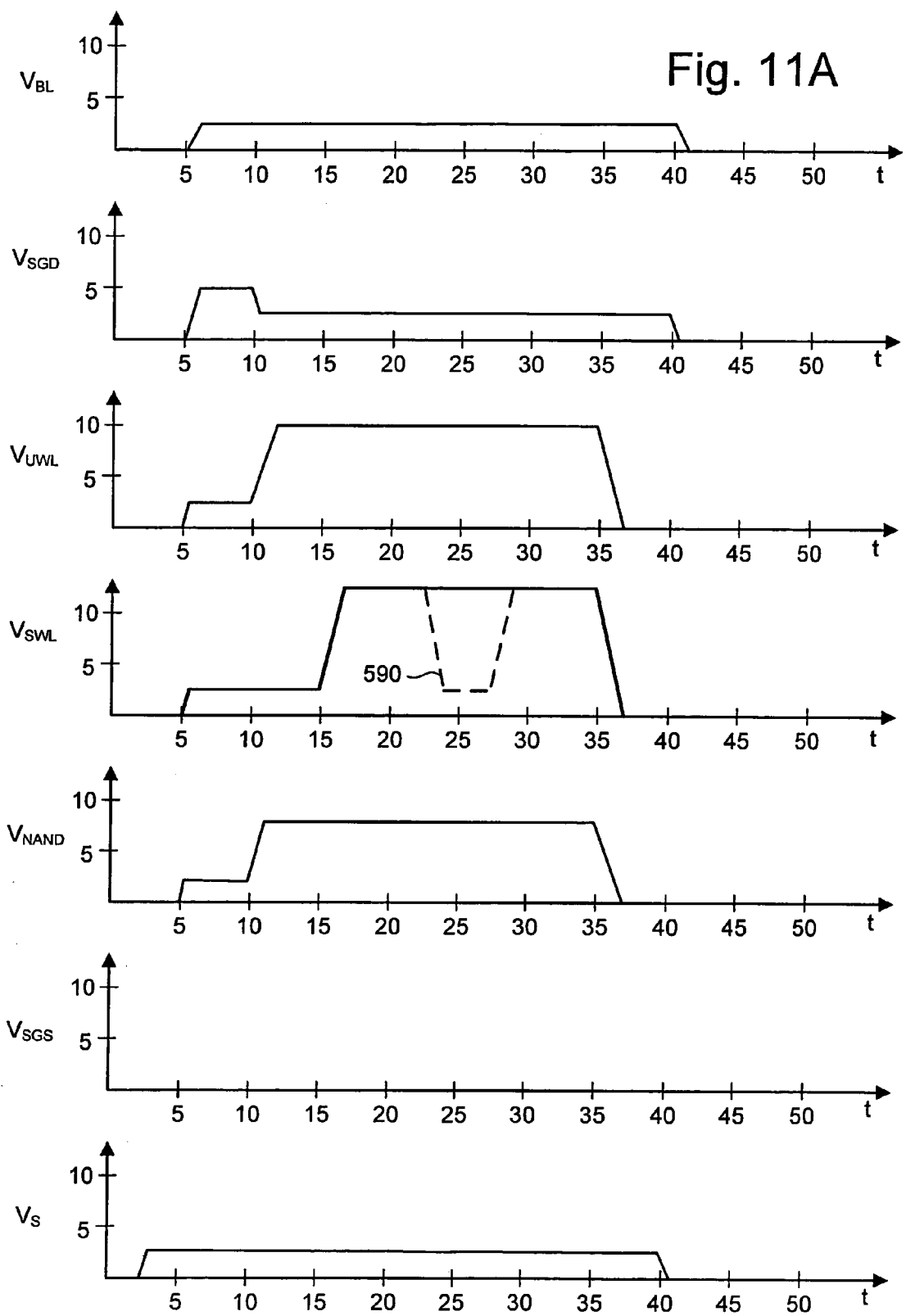
FIGS. 11A–C are timing diagrams describing various embodiments of a process for programming.
Figure 11B:
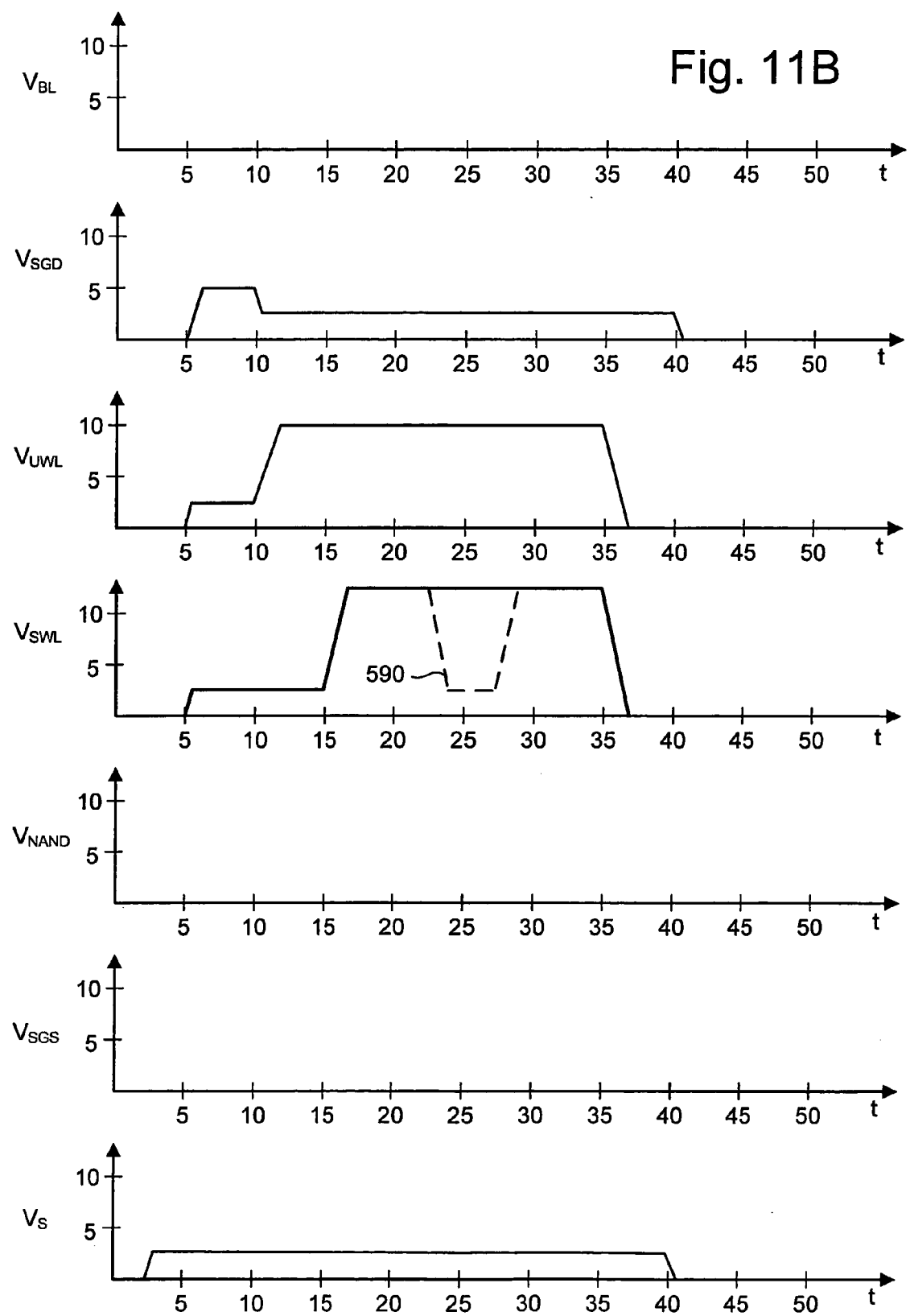
Figure 11C:
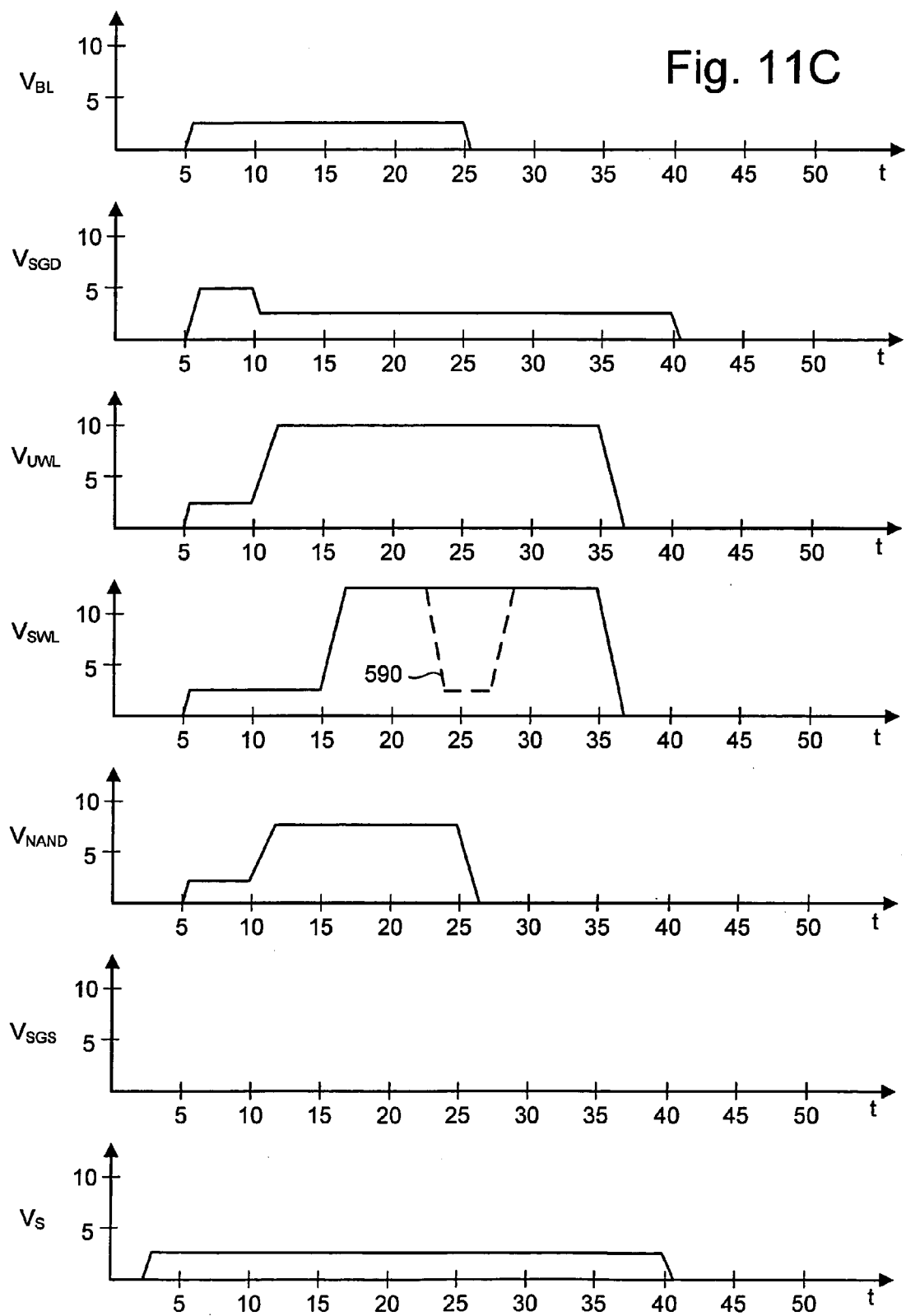

FIGS. 11A, 11B, and 11C are timing diagrams describing various embodiments for performing the boosting and program pulse step 520 of FIG. 9. The horizontal axis pertains to time in units of μsec. FIG. 11A describes the behavior of various signals associated with an unselected bit line (e.g., the odd bit line associated with memory cell 332 of FIG. 5) for one iteration of step 520, which includes one programming pulse. FIG. 11A shows the bit line voltage $V_{BL}$ being at Vdd (e.g., 2.5 volts) from 5 μsec to 40 μsec. This inhibits the NAND string associated with that particular bit line. The select gate voltage $V_{SGD}$ (the voltage at the control gate of the select transistor SGD) is raised to 5 volts at 5 μsec and then lowered to 2.5 volts (e.g. Vdd) at 10 μsec, where it remains until 40 μsec. The period when $V_{SGD}$ is at 5 volts, between 5 μsec and 10 μsec, is used to increase the pre-charge voltage level of the NAND string. As described above, in this example, it is assumed that memory cell 330 is selected for programming. Therefore, WL1 is the selected word line and the unselected word lines include WL0, WL2 and WL3. The voltage on the unselected word lines $V_{UWL}$, which corresponds to the voltage on the control gates to the memory cells connected to the unselected word lines, termed the pass voltage, is raised to Vdd at 5 μsec to allow pre-charging and then is raised to approximately 9 volts at 10 μsec to boost the NAND string associated with the unselected bit lines. The pass voltage of 9 volts will remain on the unselected word lines until approximately 35 μsec. The voltage $V_{SWL}$ on the selected word line (e.g. WL1) is raised to Vdd at 5 μsec to allow pre-charging. At 15 μsec the programming pulse is applied until 35 μsec (the solid line). In one example, the programming pulses can range between 12 volts and 20 volts. Note that the control gate of the source side select gate ($V_{SGS}$) is at 0 volts throughout and the source voltage $V_S$ is raised to Vdd at 2.5 μsec and remains there until 40 μsec. The resultant voltage in the NAND string $V_{NAND}$ first goes to the pre-charge level and then is boosted to approximately 7.5 volts in order to inhibit programming of the unselected memory cells.

FIG. 11B is a timing diagram that describes the behavior of various signals associated with a selected bit line that is in the coarse programming phase. In this example, the bit line voltage $V_{BL}$ is at 0 volts the entire relevant time to allow programming. The drain side select gate transistor receives the voltage $V_{SGD}$ that is the same as in FIG. 11A because the same select gate voltage is applied to all of the bit lines. Similarly, in one embodiment, all of the NAND strings receive the same unselected word line voltages $V_{UWL}$ and the same selected word line voltages $V_{SWL}$, regardless of whether they are being inhibited, in coarse programming or in fine programming. Therefore, $V_{UWL}$ and $V_{SWL}$ are the same in FIG. 11B as well as in 11C as they are in FIG. 11A, and similar for $V_{SGD}$ and $V_S$. However, because the bit line voltage is at 0 volts, the voltage from the boosting potentials is dissipated by conduction back to the grounded bit line and the NAND string remains at a voltage of approximately 0 volts. Consequently, when the programming pulse is received at 15 μsec, it causes electrons to tunnel into the floating gate and the selected memory cell is programmed.

FIG. 11C is a timing diagram describing the behavior of various signals associated with a selected bit line that is in one embodiment of the fine programming mode. In order to realize fine control of programming, one embodiment reduces the amount of cumulative charge tunneled into the floating gate during each associated programming pulse. In one embodiment, this is done using bit line control. One example of an implementation for fine control is to start in the program inhibit condition at the beginning of the programming pulse. Then, part way through the programming pulse (e.g. 10 μsec into a 20 μsec programming pulse), drop the bit line to its fine programming level (e.g. 0 volts, ½ volt or other value) and hold the bit line at that level for the remainder of the programming pulse. This causes the NAND string voltage to be reduced from approximately 7.5 volts to a value close to that bit line voltage (e.g., 0 volts, ½ volt or other value).

Figure 11D:
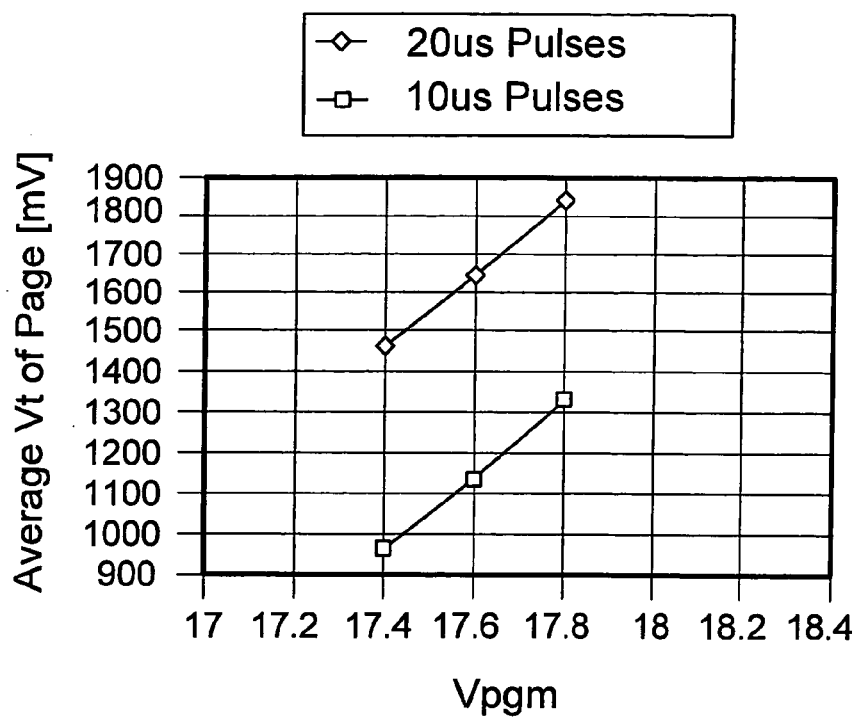
FIGS. 11D, 11E and 11F plot experimental results of reduced programming speeds for various combinations of channel (NAND string) voltages and/or reduced programming times.

Starting a program pulse with the bit line in inhibit mode and dropping the bit line part way through the program pulse has the effect of reducing the effect of a program pulse by reducing effective programming time. FIG. 11D is a graph depicting the effect of shortening the program pulse. As can be seen, a longer program pulse (e.g., 20 μsec) results in a higher threshold voltage than a shorter program pulse (e.g., 10 μsec).

Figure 11E:
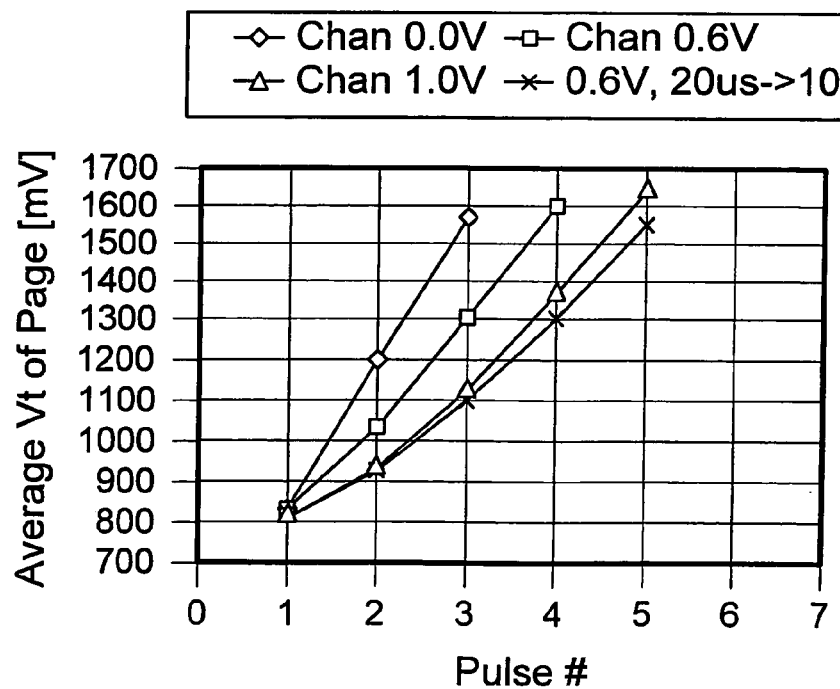
Figure 11F:
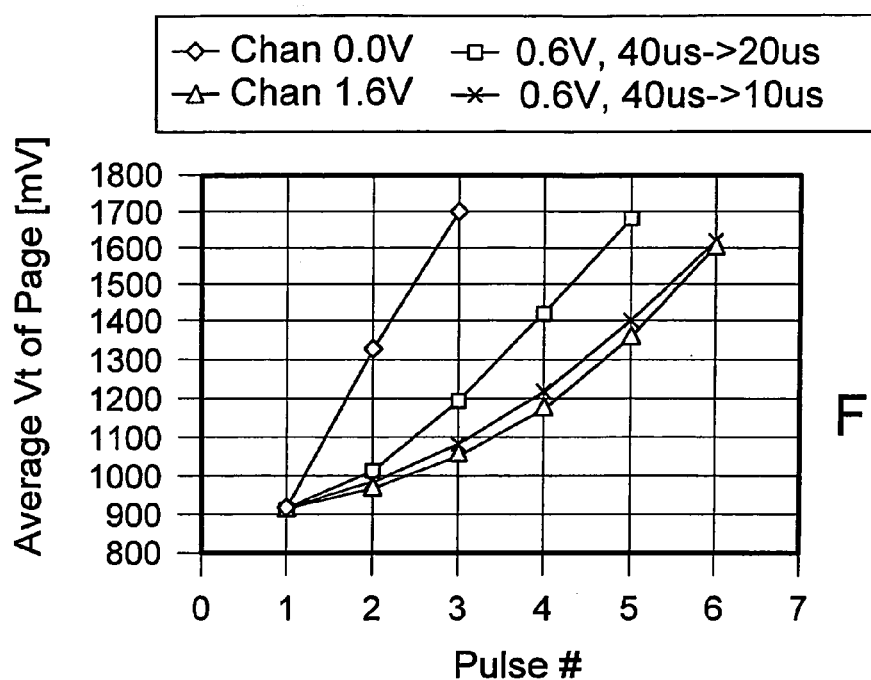

In some embodiments, the bit line is reduced from the inhibit level to a low value (e.g., 0.5 volts or another suitable low voltage other than zero volts) so that the NAND string is at a potential above 0 volts during the uninhibited portion of the program pulse for the fine phase of coarse/fine programming. As will be explained below, having the NAND string at a value above 0 volts and below the inhibit level allows for a slower and more precise programming process. For example, FIGS. 11E and 11F plot experimental results of reduced programming speeds for various combinations of channel (NAND string) voltages and reduced programming times (i.e., inhibiting for a portion of the program pulse). FIG. 11E shows four curves of fine programming Vt immediately following coarse programming. Three of the curves (channel at 0 volts, channel at 0.6 volts and channel at 1 volt) are for program pulses that are not inhibited for 20 μsec, with a pulse step size increase of 400 mv per step. The fourth curve is for a channel at 0.6 volts, for program pulses that are not inhibited for 10 μsec, and a pulse step size increase of 400 mv. Note that the first pulse is under the same conditions for each curve (i.e. the last in a sequence of coarse pulses) and the changes start at the second (or immediately following the onset fine programming) pulse. Similarly, FIG. 11F shows four curves. Two of the curves (channel at 0 volts and channel at 1.6 volts) are for program pulses that are not inhibited for 40 μsec, with a pulse step size increase of 400 mv. The third curve is for a channel at 0.6 volts, for program pulses that are not inhibited for 20 μsec, and a pulse step size increase of 400 mv. The fourth curve is for a channel at 0.6 volts, for program pulses that are not inhibited for 10 μsec, and a pulse step size increase of 400 mv. Note that the first pulse denotes the last coarse mode programming pulse for each curve and the changes associated with fine programming start at the second pulse.

In accord with the above explanation, the timing diagram in FIG. 11C, shows the bit line voltage being raised to Vdd at 5 μsec and remaining at Vdd until the middle of the programming pulse, at 25 μsec. In other embodiments, the bit line can be dropped from Vdd to 0 volts at times other than halfway through the pulse (e.g. one-quarter of the way through the pulse, three-quarters of the way through the pulse, etc.). In other embodiments, the bit line can be dropped from Vdd to a low voltage other than 0 v (e.g., 0.6 v) at the middle of the programming pulse or other selected time. The voltage at the select gate $V_{SGD}$, the voltage at the unselected word lines $V_{UWL}$ and the voltage at the selected word line $V_{SWL}$ are the same as discussed above with respect to FIGS. 11A and 11B. The voltage in the NAND string is first pre-charged at 5 μsec and then boosted to approximately 7.5 volts at 10 μsec. When the bit line voltage is dropped part way through the pulse, the NAND voltage will decrease from 7.5V to approximately 0V (or other predetermined low bit line voltage) at that corresponding time. Note that the selected word line programming pulse is applied from 15 μsec until 35 μsec.

Figure 12:
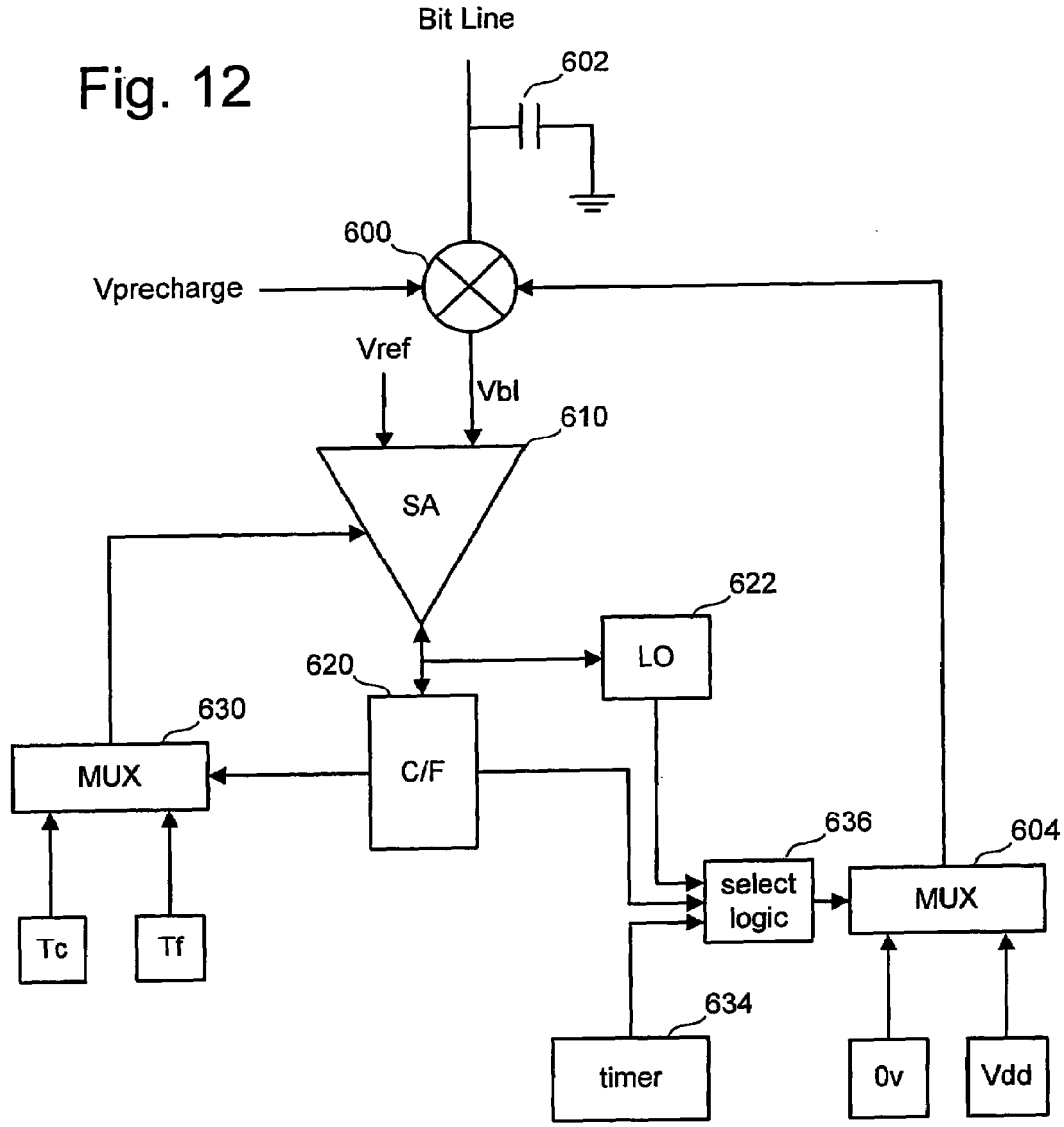
FIG. 12 is a block diagram of one embodiment of components used to verify and program a non-volatile memory cell.

FIG. 12 is a block diagram depicting components used to implement one embodiment of the processes of FIGS. 9–11. FIG. 12 shows a circuit for one bit line. In one embodiment, there would be one such circuit for each bit line of the array. In another embodiment, there would be such a circuit for a pair of bit lines (e.g., for each odd/even pair). FIG. 12 shows the bit line connected to switch 600 and capacitor 602. The other terminal of the capacitor is connected to a reference potential such as ground. Note that the capacitance may come from the capacitance of the bit line itself. Switch 600 is connected to a pre-charge voltage (Vprecharge) circuit and is also connected to an input of sense amplification circuit 610. The signal Vref is also connected to an input of sense amplification circuit 610. The output of sense amplification circuit 610 provides data to C/F register 620 and lockout register 622. The output of C/F register 620 provides data to multiplexer 630 and multiplexer 604. Multiplexer 630 receives strobe signals Tc and Tf, and chooses between the two signals based on the data from C/F register 620. The output of multiplexer 630 is connected to sense amplification circuit 610, thereby controlling the sensing related timing.

The verification operation of the components of FIG. 12 is based on a bit line discharge verification process. First, a bit line is pre-charged. Next, a verification pulse is provided to the control gate of the memory cell attached to that bit line. The bit line is then allowed to discharge. Based on the rate of discharge, it can be determined whether the memory cell is above or below a particular threshold voltage level.

Figure 12A:
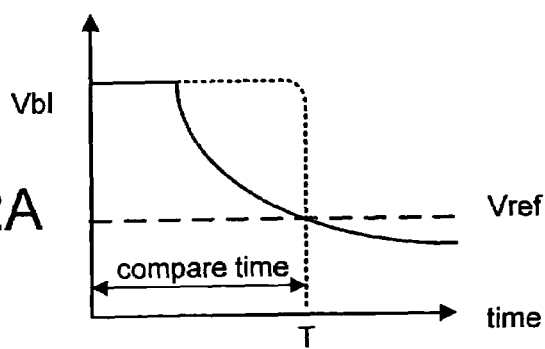
FIG. 12A is a graph of bit line voltage versus time for sensing.

FIG. 12A shows a graph of bit line voltage (Vb1) versus time. In one implementation, starting from a precharge condition, the bit lines are allowed to discharge over a period of time T. At time T, the voltage of the bit line is compared against the reference voltage Vref. If the bit line voltage is greater than Vref, then the memory cell has a lower driving capability and is more programmed than the target threshold voltage. If at time T the bit line voltage is less than Vref, then the threshold voltage of the memory cell is less than the target threshold. For a memory cell being programmed using the coarse/fine methodology, in one embodiment (see FIG. 12) the amount of time T can be changed so that there is one time Tc for discharge associated with coarse programming and another time Tf associated with discharging during the fine programming. In an alternative embodiment, the compare point can be changed between coarse and fine by having one Vref for coarse and another Vref for fine programming.

In one embodiment of the apparatus depicted in FIG. 12, C/F register 420 is a 1-bit register (or latch) that indicates whether the particular memory cell is in the coarse programming mode or in the fine programming mode. The value stored by C/F register 620 is communicated to multiplexer 630. Sense amplifier 610 includes a circuit that compares the bit line voltage to the reference voltage Vref at the reference time strobe indicated by multiplexer 630. During programming, if the memory cell is in the coarse programming mode, multiplexer 630 will send the coarse mode programming reference time strobe Tc to sense amplifier 610. If, during coarse mode, sense amplification circuit 610 determines that the coarse verification process passed successfully because the bit line did not discharge to or below the fixed reference value Vref within the time indicated by Tc, then the sense amplifier 610 will cause C/F register 620 to switch from coarse state C to fine state F. If the memory cell is in the fine programming mode, multiplexer 630 will send the fine mode programming reference time strobe Tf to sense amplifier 610. If, during the fine mode, sense amplification circuit 610 determines that the fine verification process passed successfully, because the bit line did not discharge to or below the fixed reference value Vref within the time indicated by Tf, then the sense amplifier 610 will cause lock out register 622 to indicate that the memory cell should be locked out (inhibited) from further programming.

Switch 600 also receives an input from multiplexer 604. Multiplexer 604 has two inputs that can be selected: 0 volts (allows programming) and Vdd (inhibits programming). In other embodiments, different voltages can be used or more than two voltages can be used (i.e. using a multiplexer with more than two inputs). Multiplexer 604 is controlled by select logic circuit 636. Select logic circuit 636 receives data from C/F register 620, lockout register 622 and timer (or counter) 634. C/F register 620 indicates whether the memory cell is in coarse or fine mode. Lockout register 62 indicates whether the memory cell should be locked out (inhibited) from further programming. In one embodiment, timer 634 is a programmable timer that starts a timed count down at the beginning of a program pulse. Timer 634 is programmed to reach zero (and indicate so at its output) halfway through the program pulse. In other embodiment, the timer will report at times other than halfway through the pulse.

Select logic circuit 636 will cause multiplexer 604 to apply Vdd to the bit line when the memory cell is to be locked out from programming. Select logic circuit 636 will cause multiplexer 604 to apply 0 volts to the bit line when the memory cell is being programmed in the coarse mode. Select logic circuit 636 will initially cause multiplexer 604 to apply Vdd to the bit line when the memory cell is being programmed in the fine mode. Select logic circuit 636 will cause the bit line voltage to change by changing the selection sent to multiplexer 604 (as governed by timer 634) so that the output of multiplexer 604 changes from Vdd to 0 volts part of the way (e.g., halfway) through the program pulse.

In some (not all) implementations, where a large number of memory cells are being programmed concurrently, in parallel, changing the bit line voltage during a program pulse can couple a significant voltage noise onto overlying control gates for a very short period of time that can (in some cases) potentially impact program control or increase vulnerability to disturb. To what extent this becomes a limitation depends on the details of the particular design. One way to address this issue is to lower the program voltage $V_{SWL}$ to 2.5 volts just prior to lowering the bit line and then raising the program voltage back to the full magnitude after the bit line is lowered. For example, FIGS. 11A–C show dashed line 590, representing the lowering of the program voltage $V_{SWL}$ to 2.5 volts at 23 μsec and then raising the program voltage back to the full magnitude at 27 μsec (which is after the bit line is lowered).

Another set of embodiments of the invention pertain to controlling the voltage level within the NAND string. Between the two limiting conditions discussed above (full boosting of the NAND string versus the programming condition of the NAND string being at or near 0 volts) is a continuum of possible voltage conditions, the value of which can be dictated by the voltage maintained within the NAND string (e.g., ranging from 0 volts to 7.5 volts). At a given control gate voltage condition, raising the voltage in the NAND string slows down programming. For example, FIG. 13A is a graph depicting change in threshold voltage for program pulses applied during the fine phase of coarse/fine programming, immediately following the coarse phase, for different bit line voltages. The raised bit line voltage (normally at 0 volts during coarse programming) passes into the NAND string, resulting in a raised channel potential and consequent reduced voltage across the programmed cell's tunnel oxide. Therefore, the memory cell programs slower. FIG. 13A projects such reduced programming speeds in the case of a control gate staircase (e.g., see FIG. 7) with a 0.4 mv step size for the program pulses. FIG. 13A plots the cumulative increase in threshold voltage versus programming pulse number for the fine phase of coarse/fine programming immediately following the coarse phase (Vb1 equaling 0 volts), for bit line voltages (Vb1) equal to 0 volts, 0.4 volts, 0.8 volts, 1.2 volts, 1.6 volts and 2 volts. For example, by raising the bit line voltage to 1.2 volts, the programming is slowed down so that a memory cell increases its threshold voltage by 34 mv after one pulse in the fine mode, rather than by 359 mv if the bit line voltage is maintained at 0 volts, a factor of 10 in slow down.

In order to realize an arbitrary voltage level on the NAND string via control gate coupling (i.e. something less than the potential full boosted 7.5 volts), it is necessary (in one embodiment) to control the net amount of coupling that the NAND string sees. One exemplar way to do this is to discharge a portion of the coupled charge. To explain how this can be done, it is useful (for example purposes) to visualize the control gate's boosting wave form as a staircase. The actual implementation may vary from this conceptual approach depending upon the requirements of the design. For example, consider that a 9 volt boosting wave form can be formed as a nine step staircase having 1 volt per step, with nine associated time bins. Assuming that every one volt increase on the control gate can raise the NAND string voltage by approximately 0.8 volts, then the NAND string will experience a similar staircase (increasing 0.8 volts per step) as long as the corresponding bit line voltage is maintained at its inhibit (e.g. Vdd) level. When the bit line voltage is held at 0 volts, however, no voltage boosting takes place (i.e. the NAND string remains at 0 volts). In order to realize partial boosting, the bit line voltage can be raised from the 0 volt level to the inhibit level at some point during the boosting voltage staircase. If so raised after the first step, then it would get 8 volts of coupling with the control gate, or boosted to approximately 6.4 volts. Likewise, if raised after the second step, the NAND string will be boosted to approximately 5.6 volts, and so forth, thereby offering (in this example) coupled voltage levels of 0.8 volts, 1.6 volts, 2.4 volts . . . up to the full boosting potential. Note that even the 0 volt potential is available if the inhibit condition is timed to occur after the end of the staircase.

This approach can be applied to the fine programming phase of the coarse/fine programming process, which requires (in one embodiment) approximately 1.6 volts in the NAND string (in one embodiment) to get sufficiently fine programming. The control gate boosting voltage consists of two steps. The first step includes raising the boosting voltage to 7 volts. The second step includes raising the boosting voltage from 7 volts to 9 volts. In the case of coarse programming, the bit line is held at ground throughout both steps. For program inhibit, the bit line is held at the inhibit voltage throughout both steps. However, if the memory cell is going to be in the fine programming phase, then during the first step of boosting the associated bit line is held at ground and the bit line is brought up to the inhibit level for the second step. The remaining 2 volts of boosting results in a 1.6 v voltage level coupled to the NAND string.

One issue is whether the limited reservoir NAND string (e.g. consisting of 8, 16, 32, etc. cells) can support useful tunneling under the above-described conditions. For example purposes, consider a 16 cell NAND string projected to have a total capacitance of approximately 0.8 fF. The two principle components of this capacitance are (1) the channel to control gates capacitance (e.g. the series and combination of channel to floating gate through tunnel oxide capacitance and the floating gate to control gate through interpoly ONO capacitance—projected to be approximately 0.05 fF per cell) from the 15 NAND cells being bypassed, and the accumulative NAND string junction and channel capacitance to substrate/well. The capacitance of a single floating gate is projected to be approximately 0.2 fF. For a goal of shifting the threshold voltage of a cell by approximately 100 mv in a single programming pulse (e.g. for fine programming), and assuming a 60% control gate coupling ratio, this translates to a 60 mv increase in negative voltage due to charge tunneled from the NAND string cathode. Given the 4:1 ratio of NAND string capacitance to that of floating gate capacitance, this translates to a 60/4=15 mv increase in NAND string potential. While any increase in cathode potential will reduce tunneling current, such a relatively small increase will have a commensurably small impact on programming.

The bigger impact comes from the capacitive coupling of the programming control gate (which can go up to approximately 20 volts) to the NAND string. Projecting a coupling of around 6.25% (approximately 0.05 fF÷0.8 fF), the full 20 volt control gate swing (e.g. starting from 0 volts) would capacitively lift the NAND string by 1.2V, and thereby having a more substantial impact in reducing tunneling current. In order to reduce the magnitude coupled, the voltage swing needs to be reduced, and this can be accomplished by having that programming control gate start at some intermediate voltage. One approach is to have a selected control gate follow (or partially follow) the wave form of the unselected control gates during the boosting phase, thereby, reducing the amount of additional voltage increase to get to the 20-volt level. In any case, it is beneficial to have that selected control gate participate (at a full amount or partial amount) in the initial boosting to ensure communication path from the bit line through the addressed memory cell to the remainder (source side) of the NAND string.

The issue of data pattern sensitivity is linked to the issue of being able to communicate throughout the NAND string. In particular, communication needs to be maintained through the cells that are between the target cell being programmed and the source side, since those cells may have been programmed. By communication, it is meant that whatever boosting potential is targeted for the NAND string, all memory cells along that NAND string (in one embodiment) should participate in supporting that value, independent of the data pattern. Since there is a maximum threshold voltage allowed on any memory cell, this means that the boosting control gates should reach a floor level of at least that maximum threshold voltage (plus some extra for guard ban) at the time the bit line is driven from ground to the inhibit potential. This ensures that all bypass memory cells within the NAND string get the same amount of channel boosting, independent of their data pattern. Assuming that the threshold voltage floor is approximately 4.25 volts and the maximum control gate boosting level is 9 volts, this is approximately 4.75 volts for potential boosting, which is more than adequate for the needs of coarse/fine programming.

Figure 13B:
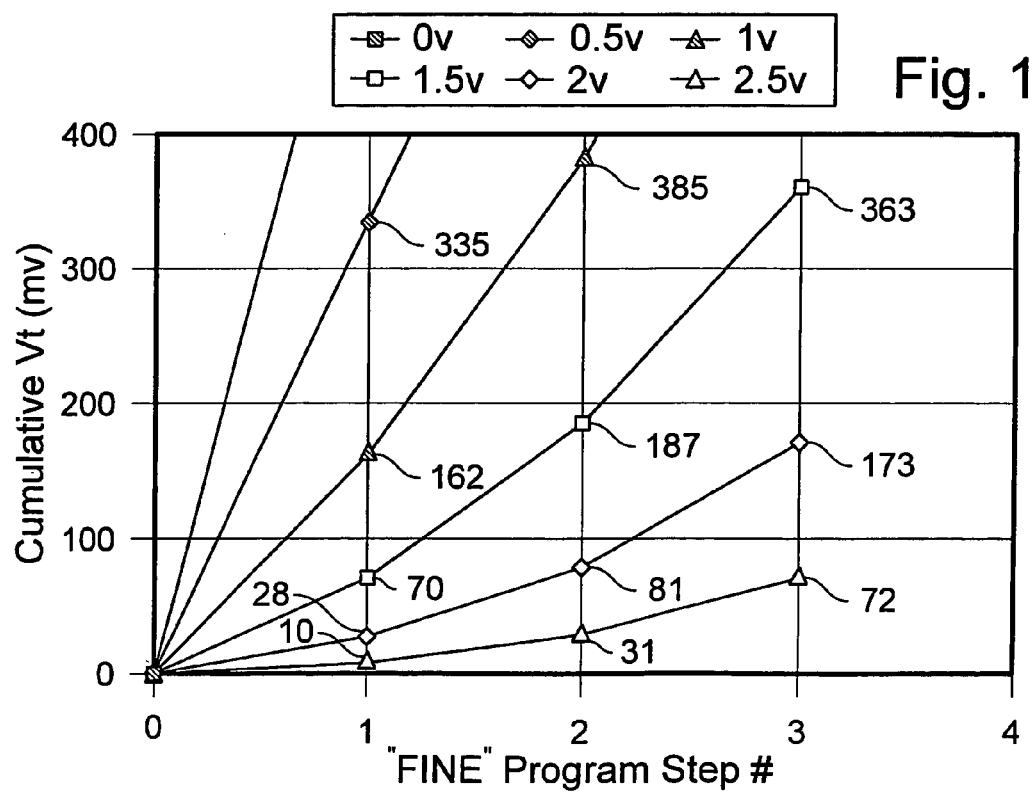
FIG. 13B is a graph depicting change in threshold voltage for program pulses applied during the fine phase of coarse/fine programming for different boosting voltages.
Figure 13A:
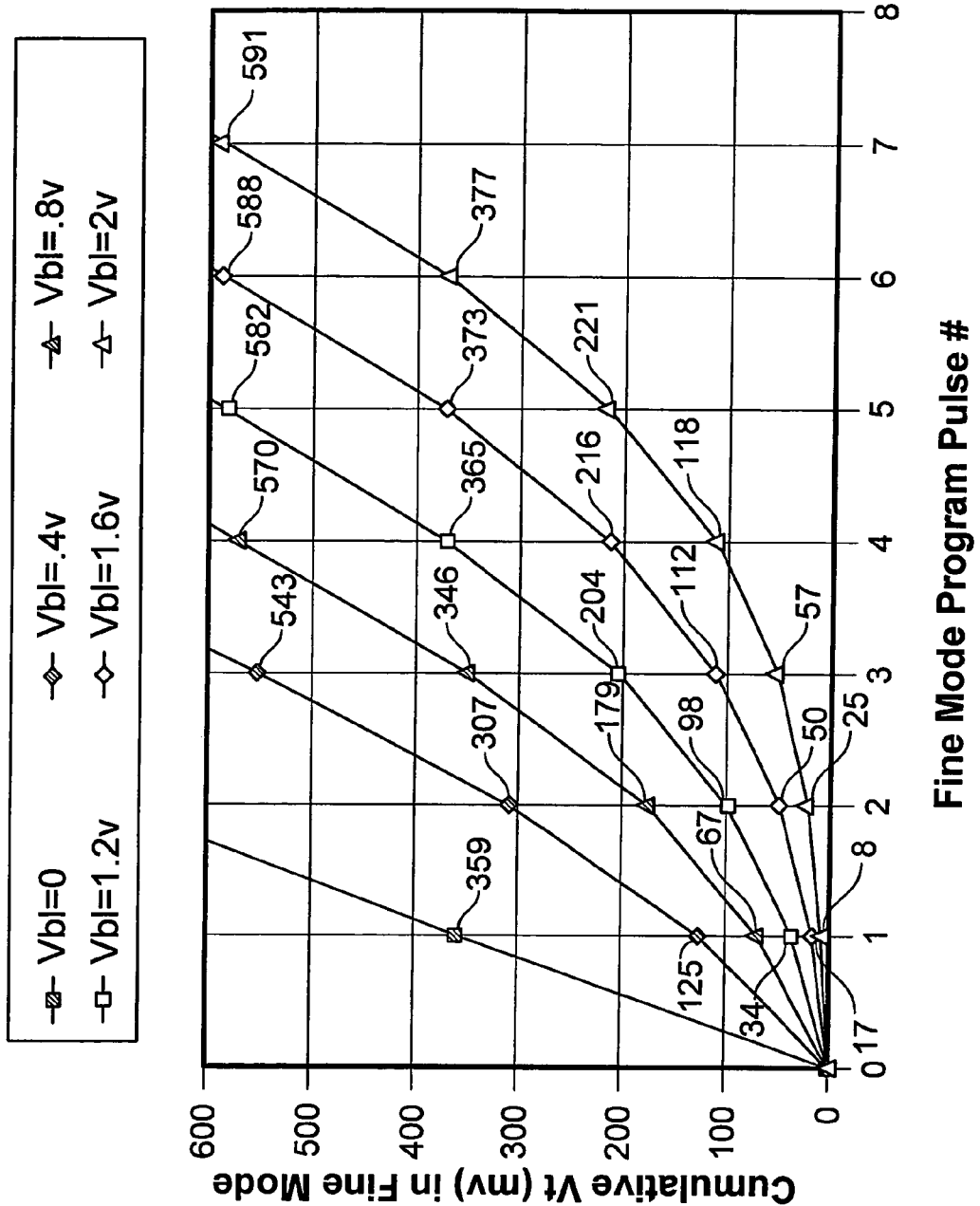
FIG. 13A is a graph depicting change in threshold voltage for program pulses applied during the fine phase of coarse/fine programming for different bit line voltages.

FIG. 13B is a graph depicting change in threshold voltage for program pulses applied during the fine phase of coarse/fine programming for different boosting voltages. The data depicted in FIG. 13B corroborate the notion that using the boosting potential to increase the voltage of the NAND string can be used to precisely control programming. For example, FIG. 13B shows six curves, all indicting change in threshold voltage for pulses in the fine mode of coarse/fine programming immediately following the coarse programming. That is, pulse #1 is the first pulse of the fine mode and follows the coarse mode. Each of the six curves pertains to a different boosting voltage in the NAND string prior to application of the program pulse. The first curve, which has no data points depicted, pertains to a boosting voltage of 0 volts in the NAND string prior to application of the program pulse. The second curve pertains to a boosting voltage of 0.5 volts in the NAND string prior to application of the program pulse. The third curve pertains to a boosting voltage of 1.0 volts in the NAND string prior to application of the program pulse. The fourth curve pertains to a boosting voltage of 1.5 volts in the NAND string prior to application of the program pulse. The fifth curve pertains to a boosting voltage of 2.0 volts in the NAND string prior to application of the program pulse. The sixth curve pertains to a boosting voltage of 2.5 volts in the NAND string prior to application of the program pulse. As can be seen, increasing the boosting potential in the NAND string slows down programming. For example, after two pulses in the fine mode, a memory cell subjected to a boosting potential of 1 volt will have raised its threshold voltage 385 mv during the fine mode while a memory cell subjected to a boosting potential of 2.5 volts will have raised its threshold voltage 31 mv during the fine mode. Note that, in the case of FIG. 13B operation, the selected word line was held at 0 volts during the boosting phase rather than having been brought up to the boosting voltage levels of the pass word lines.

Figure 14A:
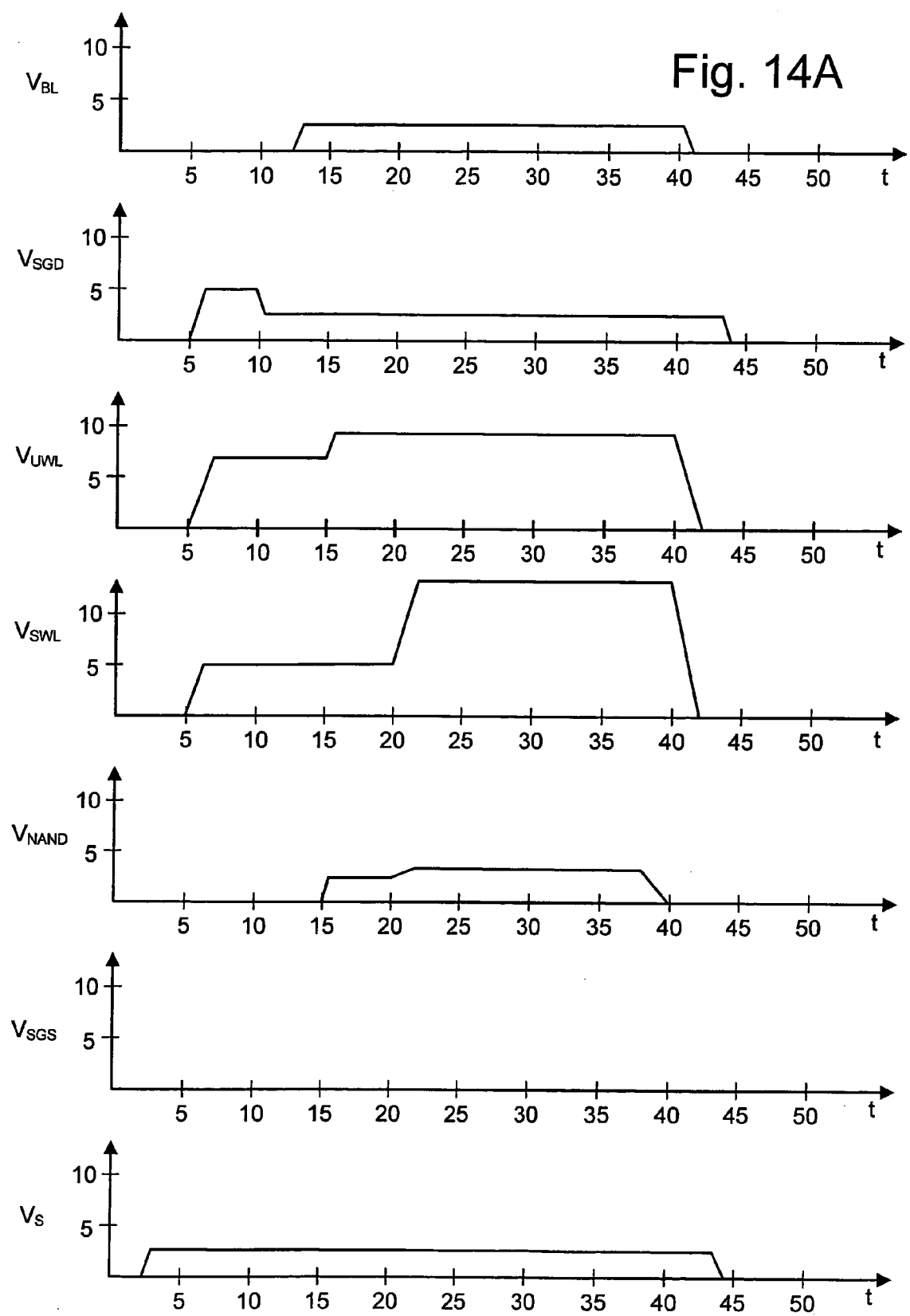
Figure 14B:
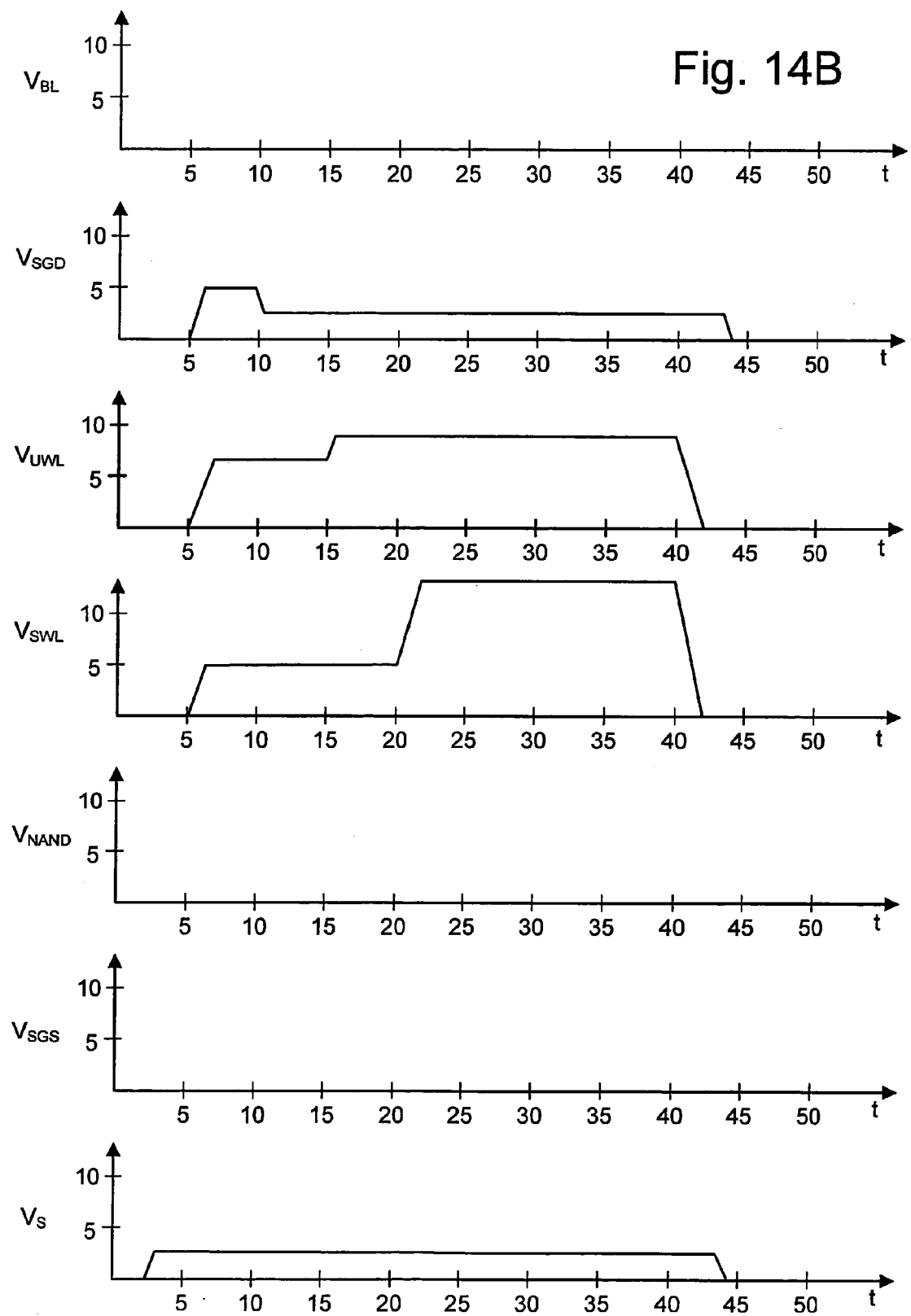

FIGS. 14A, 14B and 14C are timing diagrams describing embodiments for boosting and programming (implementing step 520 of FIG. 9) a non-volatile memory cell by partially boosting the channel/NAND string, as described above. Specifically, FIG. 14A describes the behavior of various signals for a NAND string selected for programming and experiencing the fine programming mode. The voltage $V_{SGD}$ at the control gate of the select transistor is initially ramped to 5 volts at 5 μsec to allow for full NAND string precharging, if called for. At 10 μsec, $V_{SGD}$ is brought down to Vdd to assert the bias level needed to enable inhibit and held there until approximately 43 μsec. The voltage on the unselected word lines $V_{UWL}$ is raised to approximately 7 volts at 5 μsec and held there until 15 μsec, at which time it is raised to approximately 9 volts and held there until approximately 40 μsec. The voltage $V_{SWL}$ on the selected word line is raised to approximately 5 volts at 5 μsec and held there until the start of the program pulse. The program pulse is started at 20 μsec and ends at approximately 40 μsec. The control gate of the source side select transistor $V_{SGS}$ is grounded and the source voltage $V_S$ is at Vdd. The voltage in the NAND string $V_{NAND}$ is initially at 0 volts because the bit line is grounded during the first boosting phase (when $V_{UWL}$ is raised from 0 to 7 volts). Because the bit line is raised to Vdd at about 12 μsec for the second boosting phase (e.g. just prior to the $V_{UWL}$ being raised to 9 volts), the voltage in the NAND string will be boosted to approximately 1.6 volts at 15 μsec. When the program pulse starts at 20 μsec, the voltage in the NAND string will increase slightly (through the coupling and tunneling mechanism discussed earlier, the magnitude of which depends on actual voltages and capacitances, and could be as much as one volt), and maintaining that condition until approximately 40 μsec. Because the NAND string is at least partially boosted, programming will be slowed down. That is, the number of electrons tunneling into the floating gate will be reduced and, therefore, the threshold voltage will be raised in a smaller increment than during coarse programming.

FIG. 14B is a timing diagram describing the behavior of signals on a selected bit and word lines experiencing the coarse programming mode. During the relevant time frame, the bit line is grounded. The voltage $V_{SGD}$ at the control gate of the drain side select gate transistor, the voltage $V_{UWL}$ on the unselected word lines, voltage $V_{SWL}$ on the selected word line, the source voltage and the voltage $V_{SGS}$ at the source side select transistor (being common to all of the cells of the selected block of cells targeted for programming) are all the same as in FIG. 14A. Because the bit line is grounded, the NAND string potential is maintained at or near ground and coarse mode programming occurs.

FIG. 14C is a timing diagram describing the behavior of the relevant signals associated with an unselected bit line. Because the bit line is not selected for programming, the bit line is held at Vdd. The voltages for the drain side select transistor, unselected word lines, selected word line, source side select transistor and source are the same as in FIG. 14A. Because the bit line is held at Vdd for the entire boosting process, the NAND string will be boosted to the maximum potential level according to that particular boosting signal; thereby, inhibiting programming. For example, the NAND string will boost up to 5.6 volts due to the first phase of the boosting signal, and the NAND string will boost up to approximately 7.2 volts thereafter, due to the second phase of the boosting signal. When the program pulse starts at 20 μsec, the voltage in the NAND string will increase slightly (through coupling, the magnitude of which depends on actual voltages and capacitance), and maintain the inhibit condition until approximately 40 μsec, at which point the program operation ends.

One aspect of the previously described embodiment is the introduction of a NAND string pre-charged potential just preceding the second boost. This occurs because the second boosting is enabled by raising associated bit line from 0 volts to the inhibit level e.g., Vdd). During this bit line voltage raising process, the NAND string voltage will also be raised to a level dictated by the source follower operation of the biased select gate, $V_{SGD}$. This then increases the NAND voltage by a commensurate amount. To minimize such additional NAND voltage increase (to the extent that it is undesirable), the selection voltage of the select gate can be minimized.

Figure 15:
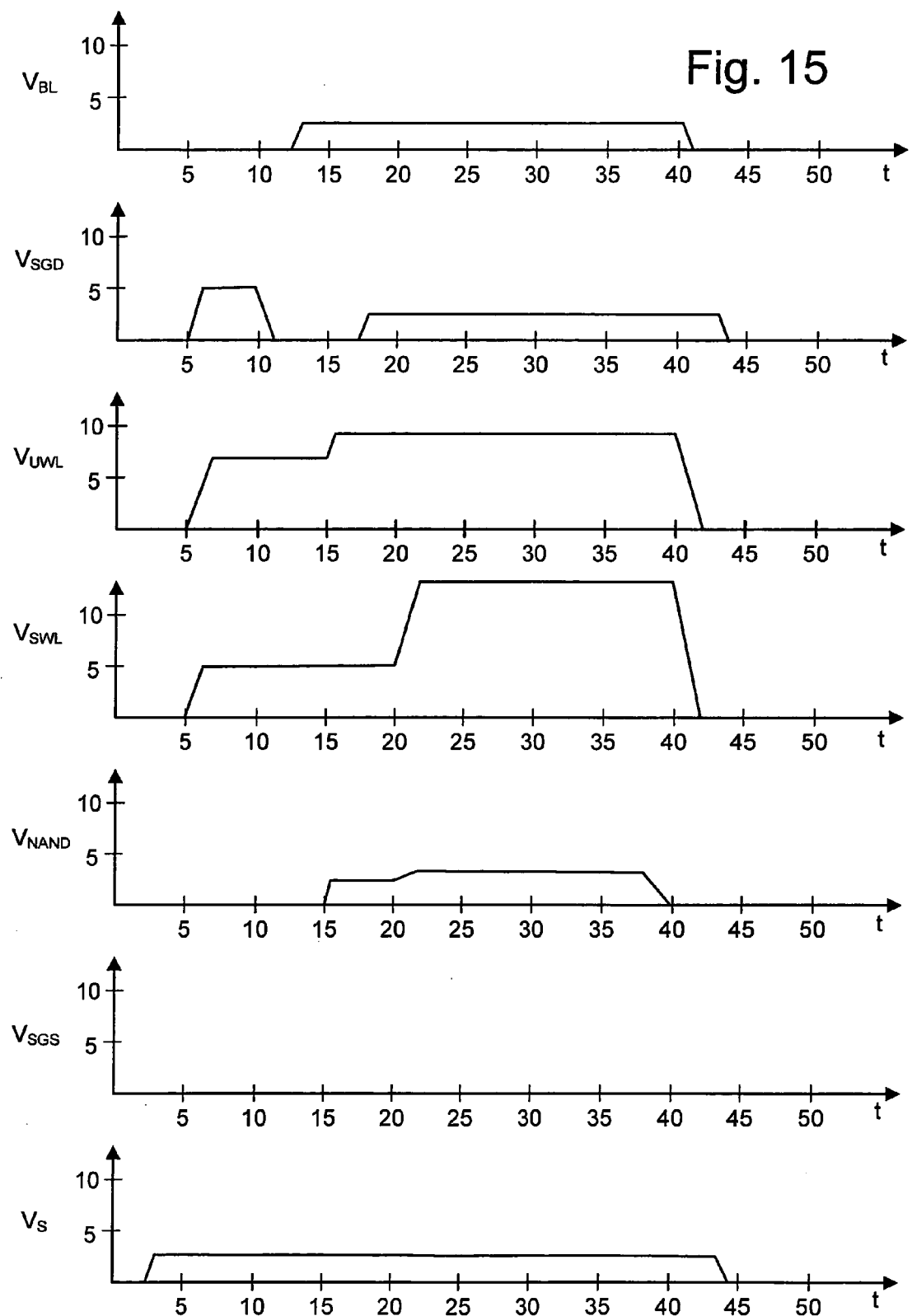

FIG. 15 describes the behavior of signals for a NAND string selected for programming during fine phase of programming, according to an alternative embodiment that reduces the voltage $V_{SGD}$ applied to the control gate of the drain side select transistor. The key difference between FIG. 15 and FIG. 14A is the select gate $V_{SGD}$ wave form. The select gate signal $V_{SGD}$, which controls communication between the NAND string and the corresponding bit line, is first raised to 5 volts at 5 μsec, as also done in the FIG. 14A embodiment. The select gate voltage $V_{SGD}$ is modified to drop its voltage to 0 volts at approximately 10 μsec and is held there until approximately 17 μsec, after which it is brought down to Vdd. Dropping the select gate voltage $V_{SGD}$ during the interval from 10 μsec to 17 μsec cuts off the NAND string from the associated bit line, during which interval the bit line voltage is raised from 0 volts (used to discharge the initial boost) to its inhibit voltage (in preparation for enabling the second boost) and the second boosting step is performed. By performing this boosting first before turning on the $V_{SGD}$ device and its associated source follower action, the NAND string does not get raised to the above-described source follower voltage starting condition prior to its second boost. This boosting approach, therefore, incurs no further additional voltage onto the NAND string, beyond that coupled capacitively, once the coupled voltage exceeds the select gate voltage minus the threshold voltage.

Note that the apparatus of FIG. 12 (or variations thereof) can also be used to implement the embodiments of FIGS. 14–15. Countdown timer 634 can be used to determine the timing for raising the bit line voltage $V_{BL}$ between phases of the boosting voltage. Alternatively, the timing of the bit line being raised can be performed by software; can be performed by comparing the unselected word line voltage to a comparator and acting accordingly; or other means known or to be known by those skilled in the art. The processes of FIGS. 9 and 10 also apply to the embodiments of FIGS. 14–15.

The above-described embodiments control programming speed and/or precision by program time control or NAND string voltage (or channel voltage) control for implementing the fine phase of coarse/fine programming. The same techniques can also be used to control precision and timing for memory cells that are not using coarse/fine programming. For example, the above approach can be used to provide data-state customized programming by providing data-state dictated programming NAND string voltages or times. In one embodiment, the idea is to provide the optimal NAND string (or channel) voltages or program times for each data state.

Using the boosted NAND string voltage technique, programming of the highest threshold voltage state would use the lowest boosted voltage (possibly having the NAND string held statically at 0 volts), while progressively lower threshold voltage states would use higher boosted voltages. During concurrent programming of all sates, this can reduce the number of pulses needed to program all of the different threshold voltage states. Similar consideration applies to using a forced NAND string voltage in direct communication with a variable bit line voltage implementation.

In the case where timing during a program pulse is used, the bit line can be dropped from Vdd to 0 volts at different times, depending on which data state the particular memory cell is being programmed to. The upper threshold voltage states will have the bit line dropped earlier and the lower states having the bit line dropped later. For example, in a 4 state memory cell, the most heavily programmed state (see threshold distribution 466 of FIG. 6) can have the bit line dropped before the applied program pulse. For memory cells programmed to the middle state (see threshold voltages distribution 464 of FIG. 6), the bit line can be dropped from Vdd to 0 at 25% of the program pulse (5 μsec into a 20 μsec pulse). For memory cells programmed into the lowest programmed state (see threshold voltage distribution 462 of FIG. 6), the bit line can be dropped 50% into the program pulse (10 μsec into a 20 μsec pulse).

Figure 16:
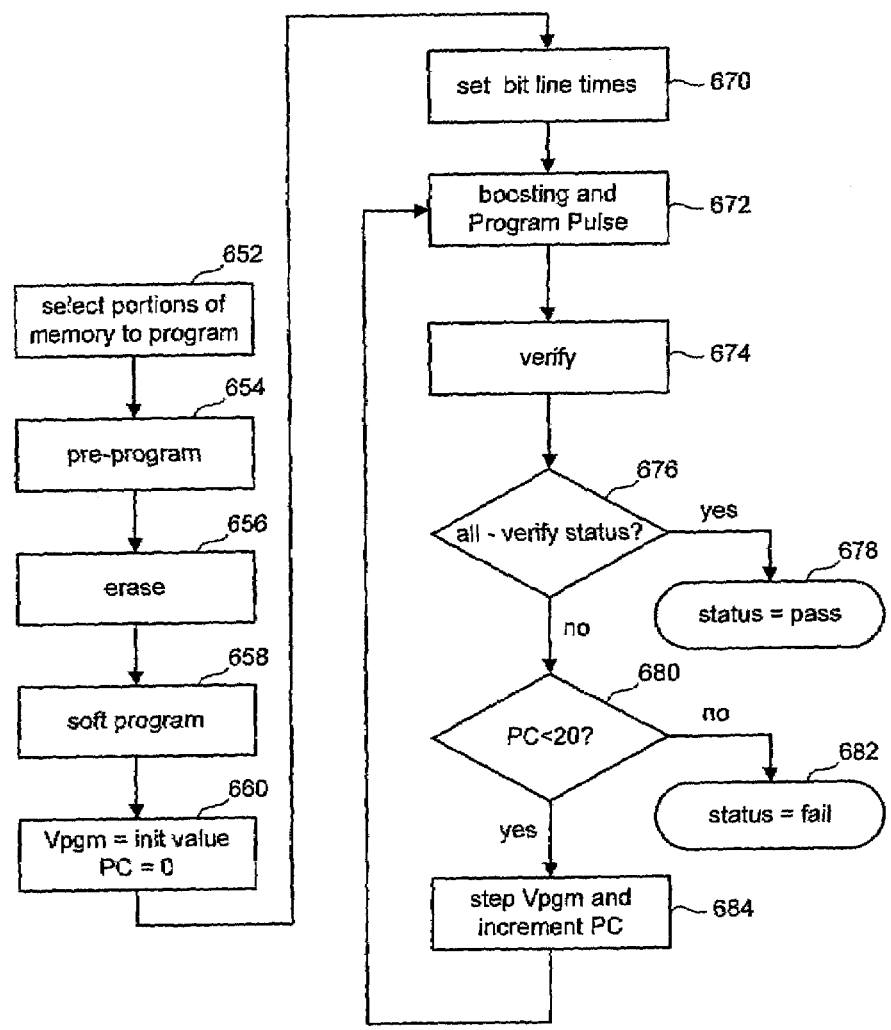
FIG. 16 is a flow chart describing one embodiment of a process for programming flash memory.

FIG. 16 is a flow chart for describing a process for programming according to this alternate embodiment where multiple memory cells are programmed concurrently to multiple programming states by adjusting the bit line appropriately as discussed above. Steps 652–660 are similar to steps 502–510 for FIG. 9. In step 670, the appropriate bit lines times are set. For example, in the embodiment where the bit line voltage is changed during the program pulse, a time value will be stored for each bit line to indicate how far into the pulse the bit line should be dropped from Vdd to 0. For the embodiment that uses the multiple boosting phases, a timing value will be stored for each bit line indicating at which time during boosting phase the bit line should be raised. In step 672, the boosting is performed and the program pulse is applied. In step 674, the memory cells are verified to determine whether the threshold voltage has reached the corresponding state target levels. Steps 676–684 of FIG. 16 are similar to steps 524–532 of FIG. 9. After step 684, the process loops back to step 672 for the next program pulse.

Figure 17A:
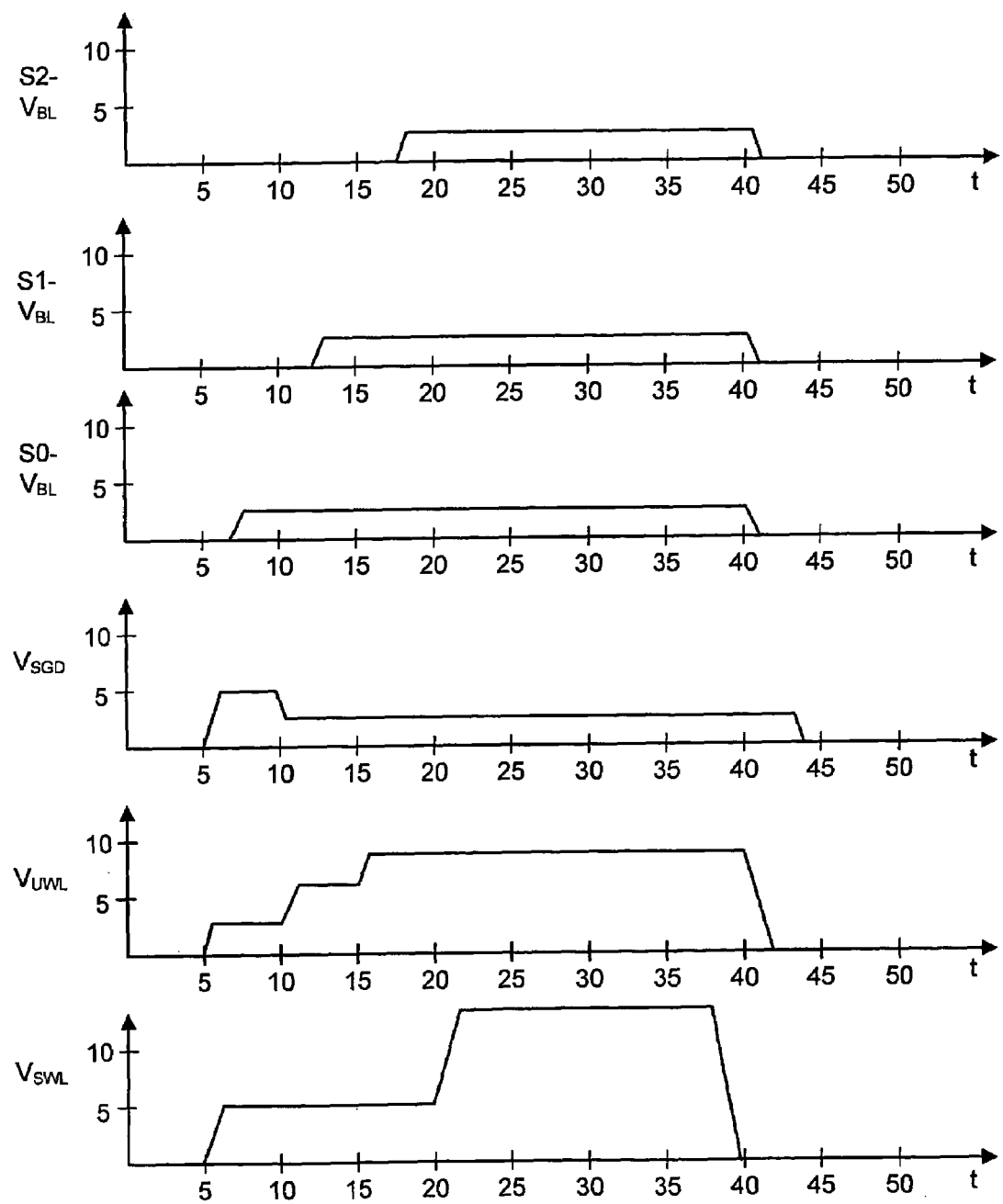
FIGS. 17A and 17B are timing diagrams describing various embodiments of a process for programming.

FIG. 17A depicts one embodiment of a process for performing step 672 of FIG. 16 for the implementation when multiple boosting phases are used to control the amount of programming. FIG. 17A shows three bit line voltages for three different memory cells being programmed. Bit line voltage S2-$V_{BL}$ corresponds to a memory cell being programmed to threshold voltage distribution 466 of FIG. 6. Bit line voltage S1-$V_{BL}$ corresponds to a memory cell being programmed to threshold voltage distribution 464. Bit line S0-$V_{BL}$ corresponds to a memory cell being programmed to threshold distribution 462. Note that the select gate wave form $V_{SGD}$ and the selected word line wave form $V_{SWL}$ are similar to that of FIG. 14A. However, the unselected word line voltage $V_{UWL}$ is broken up into a staircase with three boosting phases. The first boosting phase occurs when the unselected word line voltage $V_{UWL}$ is raised from 0 to 3 volts at 5 μsec. The second boosting phase occurs when the unselected word line voltage $V_{UWL}$ is raised from 3 volts to 6 volts at 10 μsec. The third boosting phase occurs when the unselected word line voltage $V_{UWL}$ is raised from 6 volts to 9 volts at 15 μsec. Note that other values can also be used. For the memory cell being programmed into the most heavily programmed threshold voltage distribution (e.g. distribution 466 at FIG. 6), the bit line is not raised to Vdd until after the third boosting phase. Note that for this particular state S2-$V_{BL}$ could alternatively be held at 0 v throughout. The memory cell being programmed into the threshold distribution 464 (corresponding to S1-$V_{BL}$) will participate in the third boosting phase by raising its bit line after the second boosting phase. The memory cell being programmed into the threshold distribution 462 (corresponding to S0-$V_{BL}$) will participate in the second and third boosting phases by raising its bit line voltage after the first boosting phase. Note that although the unselected word line's boosting signal is shown as a staircase, the boosting signal can also be shown as a straight line or a curve with the various boosting phases just being part of portions of the straight line or portions of the curve.

Figure 17B:
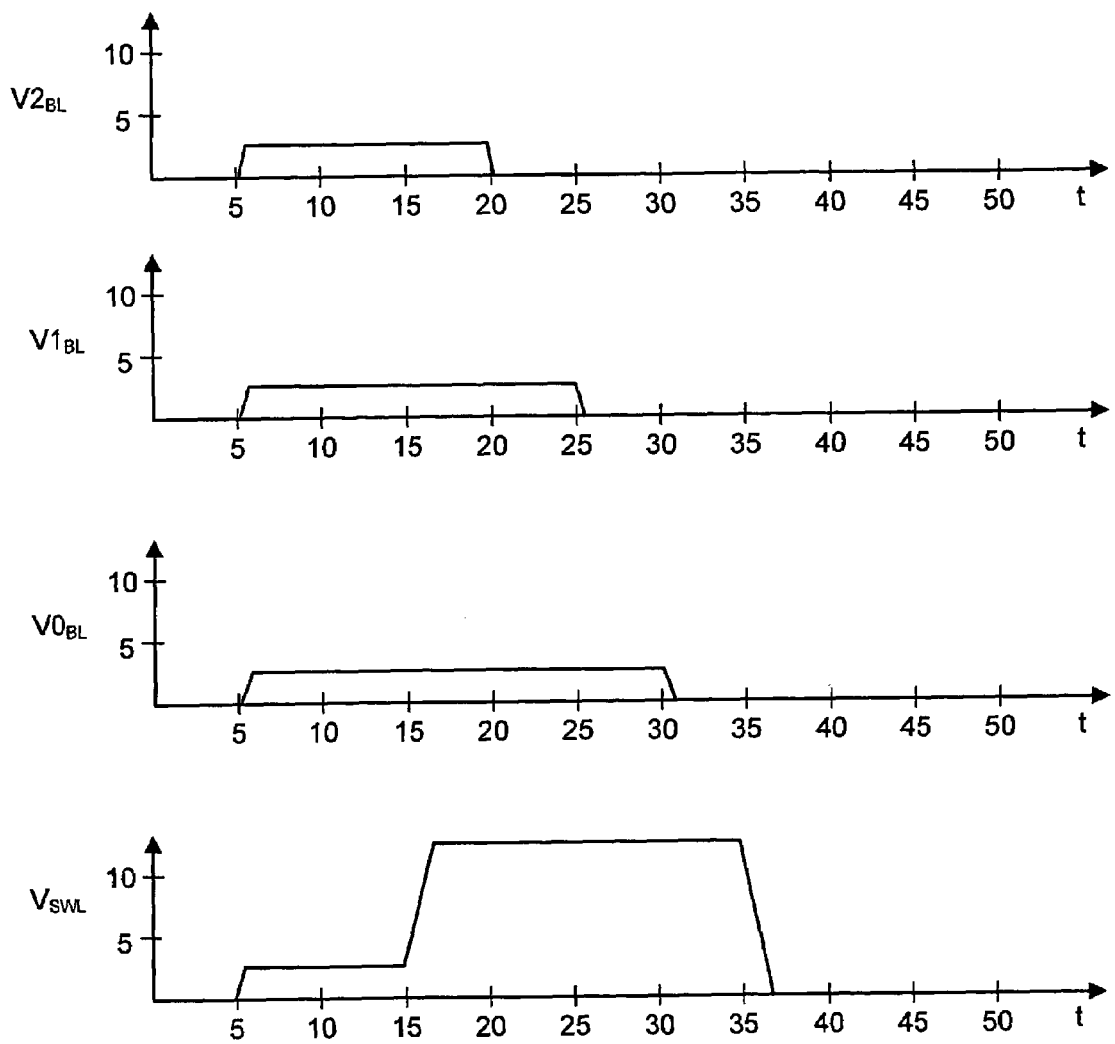

FIG. 17B is an alternative embodiment of step 672 of FIG. 16, implementing the technology for controlling programming by changing the bit line voltage during a program pulse. FIG. 17 shows bit line voltages for three memory cells. Bit line voltage $V2_{BL}$ corresponds to a memory cell being programmed to threshold distribution 466 of FIG. 6. Bit line voltage $V1_{BL}$ corresponds to memory cell being programmed to threshold voltage distribution 464. Bit line voltage $V0_{BL}$ corresponds to a memory cell being programmed to threshold voltage distribution 462. The bit line voltage $V2_{BL}$ changes from Vdd to 0 volts at 20 μsec, which is 25% into the program pulse $V_{SWL}$. The program pulse (see $V_{SWL}$) starts at 15 μsec and ends at 35 μsec. Bit line voltage $V1_{BL}$ changes from Vdd to 0 volts at 25 μsec, which is halfway through the voltage pulse. The bit line voltage $V0_{BL}$ changes from Vdd to 0 volts at 30 μsec, which corresponds to 75% into the voltage pulse. Because $V2_{BL}$ changes earlier in time, the memory cell associated with $V2_{BL}$ will receive more of a program pulse and will be more heavily programmed than memory cells associated with $V1_{BL}$ and $V0_{BL}$. Other times could be used as well to maintain the same programming weight relationship.

Figure 18:
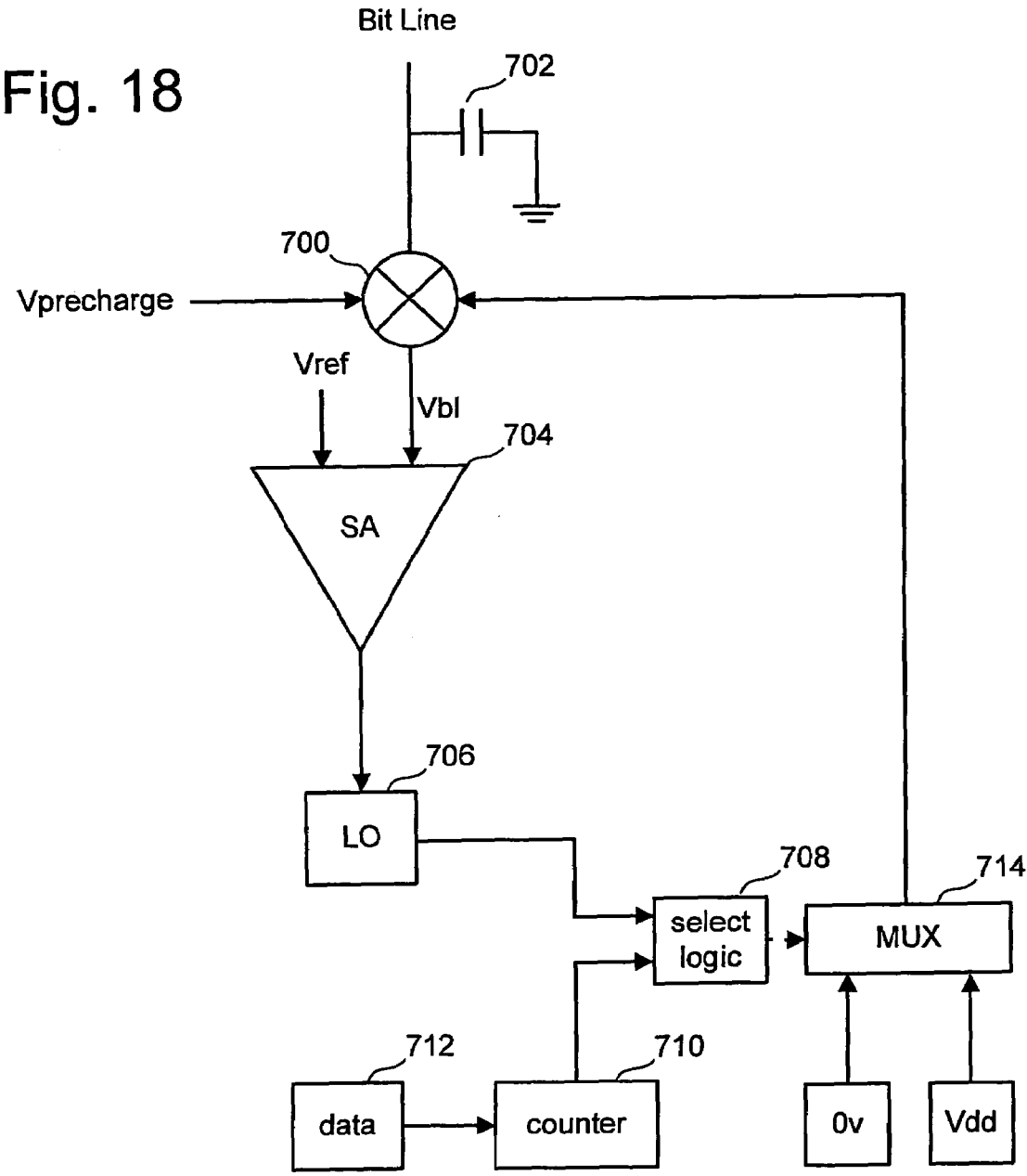
FIG. 18 is a block diagram of one embodiment of components used to verify and program a non-volatile memory cell.

FIG. 18 is a block diagram of one embodiment of components that can be used to implement the programming and verification for the embodiments of FIGS. 17A and 17B. Many of the components in FIG. 18 are similar to the components of FIG. 12. FIG. 18 shows a bit line connected to switch 700 and capacitor 702. The other terminal of the capacitor is connected to a reference potential such as ground. Switch 700 is connected to a pre-charge voltage (Vprecharge) circuit, and is also connected to an input of sense amplification circuit 704 and to an output of multiplexer 714. The signal $V_{REF}$ is connected to the input of sense amplification circuit 704. The output of sense application circuit 704 provides data to lockout register 706. The output of lockout register 706 is provided to a select logic circuit 708. In one embodiment, the apparatus of FIG. 18 does not perform coarse/fine programming and does not need to receive two different timing strobes (as implemented for FIG. 12). Rather, the timing strobe can be internal to sense amplifier 704. In an alternative embodiment, the components of FIG. 18 can be used to perform coarse/fine programming so that the embodiments described in FIGS. 17A and 17B can also be used for the fine mode of coarse/fine programming of one or more programmable states. In that case, a multiplexer can be used to provide different timing strobes or different reference voltages for the coarse and fine verify conditions. Counter 710 is connected to select logic circuit 708. Data register 712 is connected to counter 710. The output of select logic 708 is connected to multiplexer 714, which receives and chooses between 0 volts and Vdd based on the output of select logic 708.

In one embodiment, the data to be programmed is loaded into data register 712. That data is used to set up count in counter 710 to inform select logic circuit 708 when to lower the bit line voltage during a program pulse (see FIG. 17B). In another embodiment, data register 712 is used to set up count in counter 710 to inform select logic 708 when to raise the bit line voltage during the various boosting phases (se FIG. 17A) thereby establishing appropriate voltage levels provided by multiplexer 714.

In other embodiments, the timing of when to lower the bit line during a program pulse or when to raise a bit line during the various boosting phases is changed based on the pulse number in a sequence of pulses once the memory cell enters fine programming. For example, with each successive pulse in the fine programming phase, the bit line would be lowered from Vdd to 0 volts at a progressively later times during the program pulse. Similarly, during the fine phase, for each successive pulse, the bit line can be raised from 0 to Vdd during earlier boosting phases. This embodiment provides finer control as the fine programming phase progresses.

Another embodiment includes full proportional control for programming non-volatile memory. This embodiment envisions an analog error signal based on the verification process during the programming of the memory cell. The error signal is used to proportionally control subsequent programming on a cell-by-cell basis; therefore, achieving greater programming distribution tightness in shorter programming time. For example, an analog sensed voltage signal generated during the verification could be converted to an error or timing signal for controlling the amount of NAND boosting for the next programming pulse. This error signal can be used in turn to generate a higher boosted NAND-string voltage (e.g. quickening the time, during the boosting phase, in which the bit line voltage goes from 0 to the cutoff voltage level), resulting in decreased programming during the next programming pulse. Such a gradual approach to achieving the programming state may also tend to dampen the programming kick effects arising from nearest neighbor cells' lockout, as they transition from programming to inhibit. See U.S. patent application Ser. No. 10/667,222, titled "Non-Volatile Memory And Method With Bit Line To Bit Line Coupled Compensation" Raul-Adrian Cernea, Yan Li, Mehrdad Mofidi and Shahzad Khalid, filed Sep. 17, 2003, and U.S. patent application Ser. No. 10/667,223, titled "Non-Volatile Memory and Method with Bit Line Compensation Dependent on Neighboring Operating Modes," Shahzad Khalid, Yan Li, Raul-Adrian Cernea and Mehrdad Mofidi, filed Sep. 17, 2003, both of which are incorporated herein by reference in their entirety. The error signal can also be used to change the timing of when the bit line voltage is lowered from Vdd to 0 volts during the program pulse in accordance with the embodiments of FIG. 11A–C. The closer the threshold voltage is to the target threshold voltage, the later in time the bit line will drop from Vdd to 0 volts. A voltage to time conversion circuit could be realized by charging up a capacitor from the sense voltage to a higher trip-voltage level via a charging current source. The lower the sense voltage, the longer the time to trip.

Figure 19:
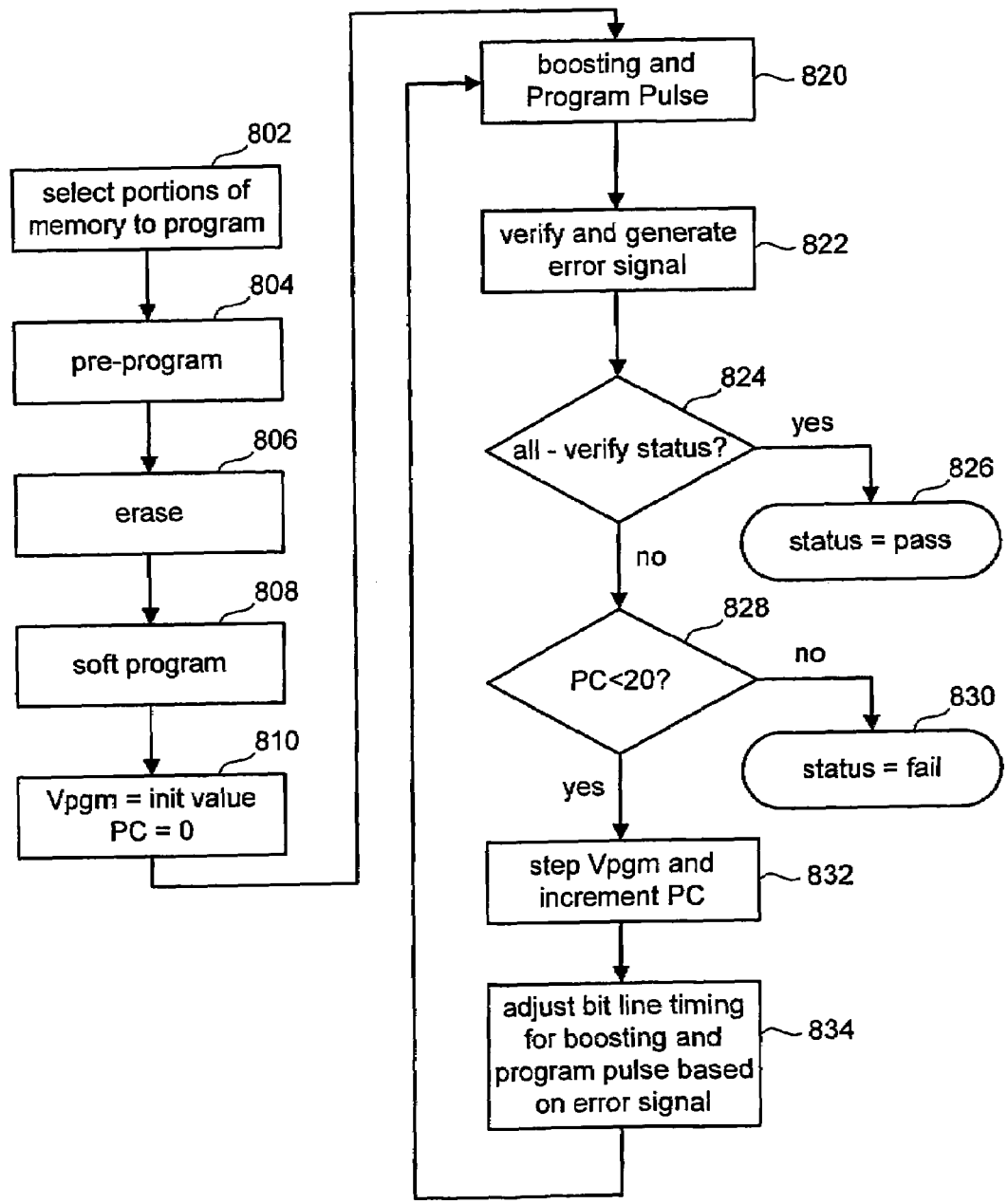
FIG. 19 is a flow chart describing one embodiment of a process for programming flash memory.

FIG. 19 is a flowchart describing a process for programming according to the embodiment that uses the error signal or according to the embodiment that reduces the programming of the successive pulses. Steps 802–810 of FIG. 19 are similar to steps 502–510 of FIG. 9. In step 820, boosting is performed and a program pulse is applied as discussed above. In step 822, verification is performed. In one embodiment, the process of FIG. 19 applies to an implementation that does not use coarse/fine programming. In another embodiment, coarse/fine programming is implemented and step 822 is used to determine the mode, as discussed above. Steps 824–832 are similar to steps 524–532. After step 832, the system adjusts the bit line timing based on error signal in step 834. In step 822, during verification, an error signal was created. This error signal is indicative of the difference between the target threshold voltage and the current level of the threshold voltage for the particular memory cell. The error signal is used to adjust the timing of the bit line voltage (as described above) in step 834. After step 834, the process moves back to step 820 and the boosting and program voltage is applied, with the bit line being controlled based on the timing set up in step 834. In the embodiment where the bit line timing is automatically adjusted for successive pulses, this adjustment is made in step 834, without the need for the error signal (in which case step 834 would adjust the bit line timing based on pulse number).

Figure 20:
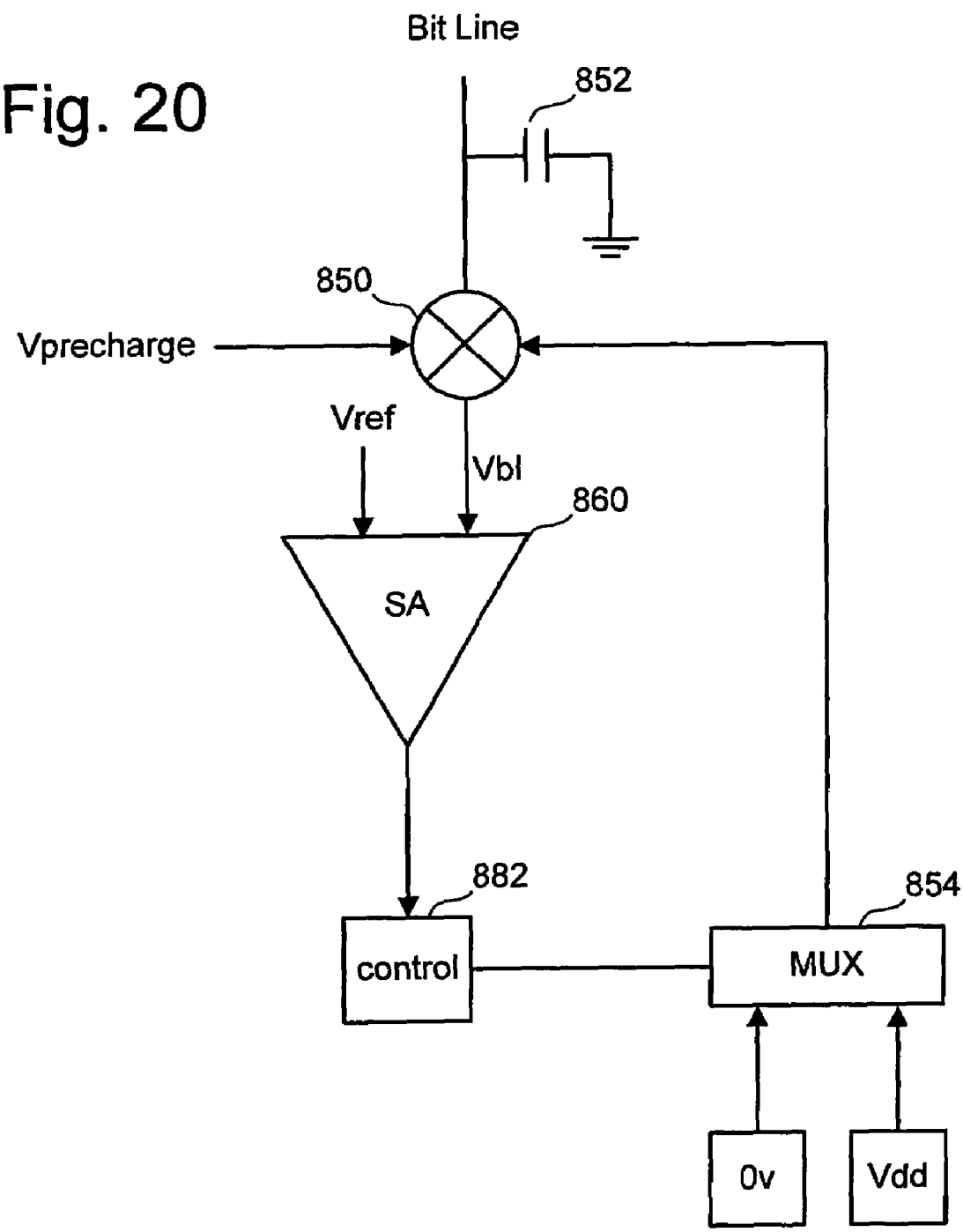
FIG. 20 is a block diagram depicting one embodiment of components used to verify and program a non-volatile memory cell.

FIG. 20 is a block diagram describing one embodiment of the components that can be used to implement the embodiments associated with FIG. 19. FIG. 20 depicts a bit line connected to switch 850 and capacitor 852. The other terminal of the capacitor is connected to a reference potential such as ground. Switch 850 is connected to a pre-charge voltage circuit ($V_{PRECHARGE}$) and is also connected to the input of sense amplification circuit 860. The signal $V_{REF}$ is also connected to the input of sense amplification circuit 860. The output of sense amplification circuit 860 is provided to control logic 882. Sense amplification circuit 860 will verify whether the threshold voltage of the memory has reached its target level and, if so, provide the lockout condition for control 882. If the target level has not been reached sense amplification circuit 860 will determine the error signal, as described above. Sense amplification circuit provides that error signal to control logic 882. Based on the error signal, control logic 882 will appropriately control the select lines for multiplier 854 to choose between its inputs for 0 volts and Vdd, so the appropriate bit line voltage is applied to the bit line at the appropriate time, via switch 850, during the next program pulse.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for programming non-volatile storage, comprising:
    applying a first program voltage to a plurality of non-volatile storage elements, a first set of said non-volatile storage elements are in a coarse programming mode and a second set of said non-volatile storage elements are in a fine programming mode;
    providing a programming bit line voltage to bit lines for said first set of non-volatile storage elements during said first program voltage;
    providing an inhibit bit line voltage to bit lines for said second set of non-volatile storage elements during said first program voltage; and
    changing said bit lines for said second set of non-volatile storage elements during said first program voltage to allow programming of said second set of non-volatile storage elements.

2. A method according to claim 1, wherein:
    said applying a first program voltage includes applying a program pulse on a first word line; and
    said changing said bit lines includes lowering said bit lines for said second set of non-volatile storage elements from said inhibit bit line voltage to a said programming bit line voltage during said pulse.

3. A method according to claim 1, wherein:
    said applying a first program voltage includes applying a program pulse on a first word line;
    said step of changing said bit lines includes lowering said bit lines for said second set of non-volatile storage elements from said inhibit bit line voltage to a program level at different times during said pulse based on a differential between current threshold voltage levels and target threshold voltage levels.

4. A method according to claim 1, wherein:
    said programming bit line voltage is zero volts.

5. A method according to claim 1, wherein:
    said changing includes performing one change to said bit lines.

6. A method according to claim 1, further comprising:
    applying a pre-charging voltage to said non-volatile storage elements prior to applying said first program voltage.

7. A method according to claim 1, further comprising:
    lowering said first program voltage; and
    raising said first program voltage, said changing said bit lines is performed after lowering said first program voltage and prior to raising said first program voltage.

8. A method according to claim 1, wherein:
    said plurality of non-volatile storage elements are flash memory devices.

9. A method according to claim 1, wherein:
    said plurality of non-volatile storage elements are multi-state flash memory devices.

10. A method according to claim 1, wherein:
    plurality of non-volatile storage elements are NAND flash memory devices.

11. A non-volatile storage system, comprising:
    a first non-volatile storage element; and
    a control circuit in communication with said first non-volatile storage element, said control circuit performs a method comprising:
        applying a first program voltage to a plurality of non-volatile storage elements, a first set of said non-volatile storage elements are in a coarse programming mode and a second set of said non-volatile storage elements are in a fine programming mode,
        providing a programming bit line voltage to bit lines for said first set of non-volatile storage elements during said first program voltage,
        providing an inhibit bit line voltage to bit lines for said second set of non-volatile storage elements during said first program voltage, and
        changing said bit lines for said second set of non-volatile storage elements during said first program voltage to allow programming of said second set of non-volatile storage elements.

12. A non-volatile storage system according to claim 11, wherein:
    said applying a first program voltage includes applying a program pulse on a first word line; and
    said changing said bit lines includes lowering said bit lines for said second set of non-volatile storage elements from said inhibit bit line voltage to said programming bit line voltage during said pulse.

13. A non-volatile storage system according to claim 11, wherein:
    said applying a first program voltage includes applying a program pulse on a first word line; and
    said changing said bit lines is performed during said pulse.

14. A non-volatile storage system according to claim 11, wherein:
    said first non-volatile storage element is a NAND multi-state flash memory device.

15. A non-volatile storage system according to claim 11, wherein:
    said first non-volatile storage element is a flash memory device.

16. A method for programming non-volatile storage, comprising:
    determining whether a first non-volatile storage element is in a coarse programming mode or a fine programming mode;
    applying a first program voltage to a control gate of said first non-volatile storage element; and
    making a first change to a bit line voltage for said first non-volatile storage element while applying said first program voltage to said control gate if said first non-volatile storage element is in said fine programming mode and not making said first change while applying said first program voltage to said control gate if said first non-volatile storage element is in said coarse programming mode.

17. A method according to claim 16, wherein:
said making said first change includes changing said bit line voltage from a first voltage level to a second voltage level.

18. A method according to claim 16, wherein:
said making said first change includes changing said bit line voltage from an inhibit level to a program level.

19. A method according to claim 16, wherein:
said applying a first program voltage to a control gate includes applying a pulse; and
said first change to said bit line voltage is made during said pulse.

20. A method according to claim 19, wherein:
said pulse includes a first portion, a second portion and a third portion;
said pulse is at a full magnitude during said first portion and said third portion;
said pulse is at a lower magnitude during said second portion; and
said change to said bit line is made during said second portion.

21. A method according to claim 16, wherein said determining whether a first non-volatile storage element is in a coarse programming mode or a fine programming mode comprises:
testing whether a threshold voltage of said first non-volatile storage element is above a coarse/fine verify level, said method for programming non-volatile storage is programming said first non-volatile storage element to a target state having a minimum threshold voltage level, said coarse/fine verify level is lower than said threshold voltage level.

22. A method according to claim 16, wherein:
said first non-volatile storage element is a flash memory device.

23. A method for programming non-volatile storage, comprising:
applying a first program voltage to a plurality of non-volatile storage elements;
providing voltage conditions on bit lines for said non-volatile storage elements while applying said first program voltage; and
making a first voltage change to bit lines for non-volatile storage elements in a fine programming mode while applying said first program voltage without making said first voltage change to bit lines for non-volatile storage elements in a coarse programming mode while applying said first program voltage.

24. A method according to claim 23, wherein:
said voltage conditions include an inhibit condition and a programming condition; and
said first voltage change includes changing bit lines for non-volatile storage elements in said fine programming mode from said inhibit condition to said programming condition while applying said first program voltage.

25. A method according to claim 24, wherein:
said applying a first program voltage includes applying a voltage pulse; and
said first voltage change is made during said voltage pulse.

26. A method according to claim 25, wherein:
said voltage pulse includes a first portion, a second portion and a third portion;
said voltage pulse is at a lower magnitude during said second portion than in comparison to said first portion and said third portion; and
said first voltage change is made during said second portion.

27. A method for programming non-volatile storage, comprising:
applying one or more program pulses to a non-volatile storage element, said non-volatile storage element is in a coarse programming stage;
maintaining a constant bit line voltage during said one or more pulses while said non-volatile storage element is in said coarse programming stage;
verifying that said non-volatile storage element has reached a fine programming stage;
applying one or more program pulses to said non-volatile storage element while said non-volatile storage element is in said fine programming stage; and
changing said bit line voltage during said one or more pulses while said non-volatile storage element is in said fine programming stage.

28. A method according to claim 27, wherein:
said changing said bit line voltage during said one or more pulses includes changing between an inhibit voltage and a programming voltage.

29. A non-volatile storage system, comprising:
a plurality of non-volatile storage elements; and
a control circuit, said control circuit applies a first program voltage to said non-volatile storage elements and provides voltage conditions on bit lines for said non-volatile storage elements while applying said first program voltage, said control circuit makes a first voltage change to bit lines for non-volatile storage elements in said fine programming mode while applying said first program voltage without making said first voltage change to bit lines for non-volatile storage elements in said coarse programming mode while applying said first program voltage.

30. A non-volatile storage system according to claim 29, wherein:
said voltage conditions include an inhibit condition and a programming condition; and
said first voltage change includes changing bit lines for non-volatile storage elements in said fine programming mode from said inhibit condition to said programming condition.

31. A non-volatile storage system according to claim 29, wherein:
said first program voltage includes a voltage pulse; and
said first voltage change is made during said voltage pulse.

32. A non-volatile storage system according to claim 29, wherein:
said non-volatile storage elements are multi-state flash memory devices.

33. A non-volatile storage system according to claim 29, wherein:
said non-volatile storage elements are NAND flash memory devices.

34. A non-volatile storage system according to claim 29, wherein said control circuit comprises:
a plurality of sense circuits in communication with said non-volatile storage elements;
coarse/fine storage devices in communication with said sense circuits;
first selection circuits in communication with said coarse/fine storage devices and said non-volatile storage elements, said first selection circuits choose between two voltages to apply to said non-volatile storage elements based on said coarse/fine storage device;

second selection circuits in communication with said coarse/fine storage devices, said second selection circuit choose between two verification parameters for said non-volatile storage elements.

35. A non-volatile storage system, comprising:
a non-volatile storage element;
a bit line and a word line in communication with said non-volatile storage element;
a sense circuit in communication with said bit line;
a coarse/fine storage device in communication with said sense circuit;
a timer, said timer identifies a time during a program pulse applied to said non-volatile storage element using said word line;
a first selection circuit in communication with said coarse/fine storage device and said timer and said bit line, said first selection circuit chooses between two voltages to apply to said bit line based on said timer identifying said time and said coarse/fine storage device;
a second selection circuit in communication with said coarse/fine storage device and said sense circuit, said second selection circuit chooses between two verification parameters for said non-volatile storage element.

36. A non-volatile storage system according to claim 35, wherein:
said first selection circuit changes selection between said two voltages during said pulse.

37. A non-volatile storage system according to claim 35, further comprising:
said first selection circuit changes selection from an inhibit voltage to a programming voltage during said pulse.

* * * * *